US012713776B2

(12) United States Patent
Eguchi et al.

(10) Patent No.: US 12,713,776 B2
(45) Date of Patent: Aug. 18, 2026

(54) DISPLAY DEVICE

(71) Applicant: SEMICONDUCTOR ENERGY LABORATORY CO., LTD., Atsugi (JP)

(72) Inventors: Shingo Eguchi, Atsugi (JP); Kenichi Okazaki, Atsugi (JP); Hiroki Adachi, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 272 days.

(21) Appl. No.: 18/273,805

(22) PCT Filed: Jan. 25, 2022

(86) PCT No.: PCT/IB2022/050619

§ 371 (c)(1),
(2) Date: Jul. 24, 2023

(87) PCT Pub. No.: WO2022/167894

PCT Pub. Date: Aug. 11, 2022

(65) Prior Publication Data

US 2024/0081097 A1 Mar. 7, 2024

(30) Foreign Application Priority Data

Feb. 5, 2021 (JP) ................................ 2021-017115

(51) Int. Cl.
*H10K 59/122* (2023.01)
*H10K 50/13* (2023.01)
(Continued)

(52) U.S. Cl.
CPC ........... *H10K 59/122* (2023.02); *H10K 50/13* (2023.02); *H10K 59/1201* (2023.02);
(Continued)

(58) Field of Classification Search
CPC .. H10K 59/122; H10K 50/13; H10K 59/1201; H10K 59/124; H10K 59/131;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001310480 A 8/2001
EP 1128436 A 8/2001
(Continued)

OTHER PUBLICATIONS

International Search Report (Application No. PCT/IB2022/050619) Dated Apr. 19, 2022.
(Continued)

*Primary Examiner* — Kevin Quarterman
(74) *Attorney, Agent, or Firm* — NIXON PEABODY LLP; Jeffrey L. Costellia

(57) ABSTRACT

A display device with high display quality is provided. A highly reliable display device is provided. A display device with low power consumption is provided. A display device that can easily achieve higher resolution is provided. A display device with both high display quality and high resolution is provided. A display device with high contrast is provided. The display device includes a first conductive layer, a first insulating layer over the first conductive layer, a second conductive layer including a first region over the first insulating layer and a second region in an opening provided in the first insulating layer, a second insulating layer over the first insulating layer, a third insulating layer over the second region, an EL layer including a third region over the first region, a fourth region over the second insu-
(Continued)

lating layer, and a fifth region over the third insulating layer, and a third conductive layer over the EL layer. The opening is provided in the first insulating layer so as to reach a top surface of the first conductive layer. A top surface of the first region, a top surface of the second insulating layer, and a top surface of the third insulating layer are substantially level with each other.

11 Claims, 19 Drawing Sheets

(51) Int. Cl.
*H10K 59/12* (2023.01)
*H10K 59/124* (2023.01)
*H10K 59/131* (2023.01)
*H10K 59/80* (2023.01)

(52) U.S. Cl.
CPC ......... *H10K 59/124* (2023.02); *H10K 59/131* (2023.02); *H10K 59/871* (2023.02); *H10K 59/8722* (2023.02); *H10K 59/873* (2023.02)

(58) Field of Classification Search
CPC ............. H10K 59/871; H10K 59/8722; H10K 59/873; H10D 30/021; H10D 30/67; H05B 33/12; H05B 33/22; G09F 9/30
See application file for complete search history.

(56) References Cited

U.S. PATENT DOCUMENTS

| | | | | |
|---|---|---|---|---|
| 6,833,560 | B2 | 12/2004 | Konuma et al. | |
| 7,132,693 | B2 | 11/2006 | Konuma et al. | |
| 7,399,991 | B2 | 7/2008 | Seo et al. | |
| 7,663,149 | B2 | 2/2010 | Seo et al. | |
| 7,732,824 | B2 | 6/2010 | Konuma et al. | |
| 8,158,992 | B2 | 4/2012 | Konuma et al. | |
| 8,735,898 | B2 | 5/2014 | Konuma et al. | |
| 9,293,513 | B2 | 3/2016 | Konuma et al. | |
| 9,793,328 | B2 | 10/2017 | Konuma et al. | |
| 10,109,693 | B2 * | 10/2018 | Teraguchi | H10K 59/124 |
| 11,785,827 | B2 | 10/2023 | Yamazaki et al. | |
| 2001/0019133 | A1 * | 9/2001 | Konuma | H10K 71/00<br>257/40 |
| 2002/0072139 | A1 | 6/2002 | Kashiwabara | |
| 2002/0101152 | A1 * | 8/2002 | Kimura | H10K 59/878<br>313/505 |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0057330 | A1 | 2/2020 | Yamazaki et al. | |
| 2020/0203662 | A1 | 6/2020 | Mollard et al. | |
| 2020/0388659 | A1 | 12/2020 | Harrison et al. | |

FOREIGN PATENT DOCUMENTS

| | | | |
|---|---|---|---|
| EP | 1376713 | A | 1/2004 |
| JP | 2000-036385 | A | 2/2000 |
| JP | 2000-077191 | A | 3/2000 |
| JP | 2001-312223 | A | 11/2001 |
| JP | 2002-324673 | A | 11/2002 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-189937 | A | 11/2018 |
| JP | 2019-179696 | A | 10/2019 |
| JP | 2020-160305 | A | 10/2020 |
| KR | 2001-0083213 | A | 8/2001 |
| TW | 525305 | | 3/2003 |
| WO | WO-2018/087625 | | 5/2018 |

OTHER PUBLICATIONS

Written Opinion (Application No. PCT/IB2022/050619) Dated Apr. 19, 2022.

Zakhidov.A et al., “Orthogonal processing: A new strategy for organic electronics”, Chem. Sci. (Chemical Science), Apr. 7, 2011, vol. 2, No. 6, pp. 1178-1182.

Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.

Malinowski.P et al., “Photolithographic patterning of organic photodetectors with a non-fluorinated photoresist system”, Organic Electronics, Jul. 12, 2014, vol. 15, No. 10, pp. 2355-2359.

Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.

Papadopoulos.N et al., “AMOLED Displays with In-Pixel Photodetector”, Liquid Crystals and Display Technology, Jul. 9, 2020, pp. 1-19.

Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.

Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.

Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.

Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.

Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.

Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

* cited by examiner

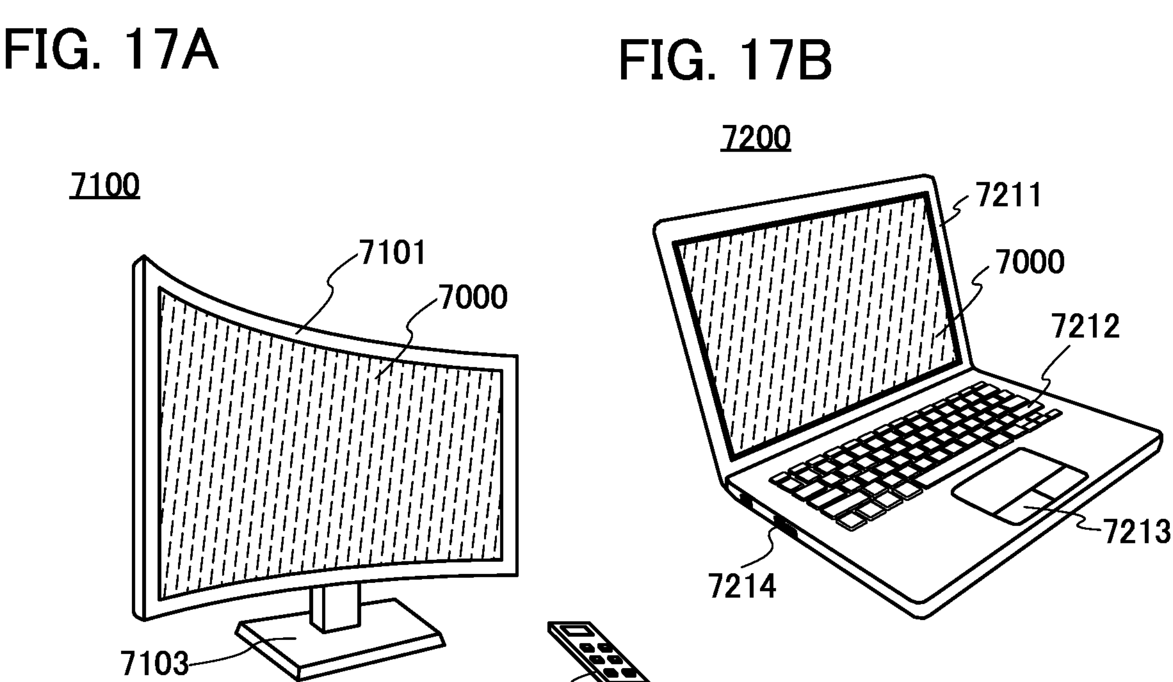
FIG. 17A
7100
7101
7000
7103
7111
FIG. 17B
7200
7211
7000
7212
7213
7214
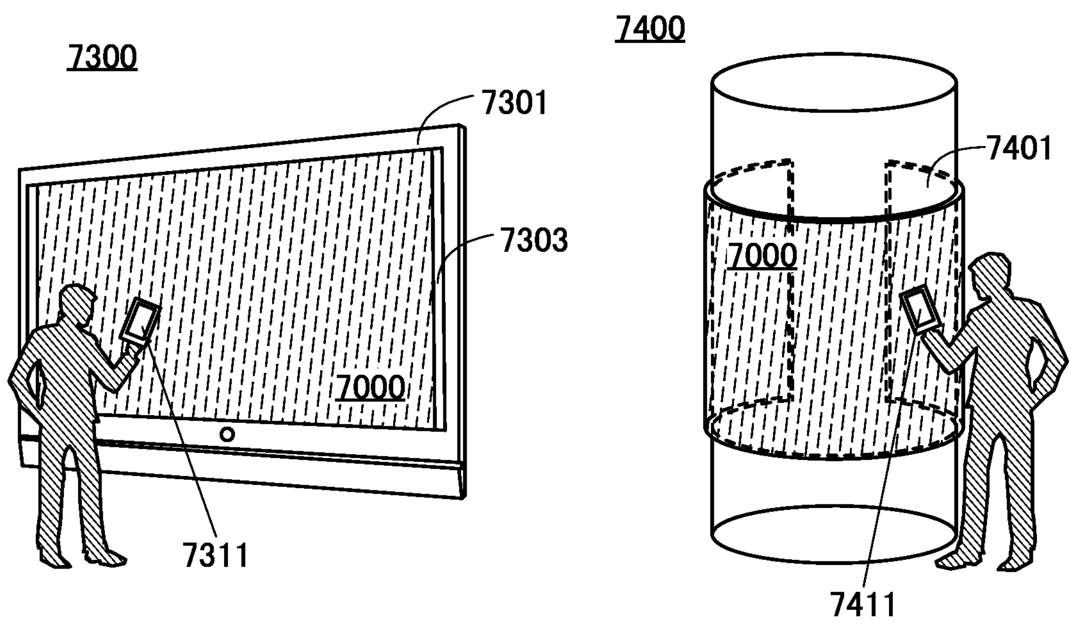
FIG. 17C
7300
7301
7303
7000
7311
FIG. 17D
7400
7401
7000
7411

FIG. 18A
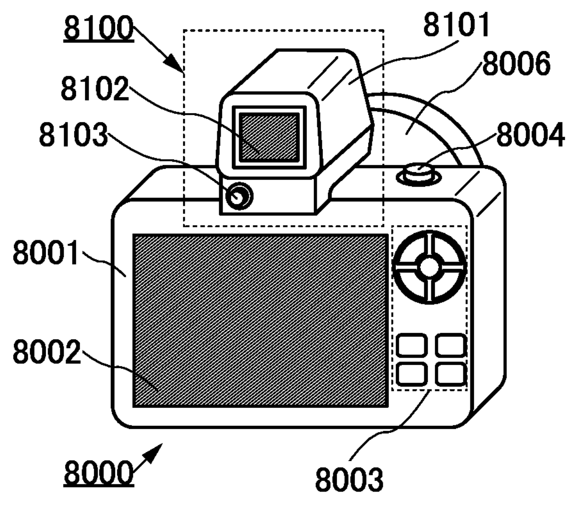
FIG. 18B
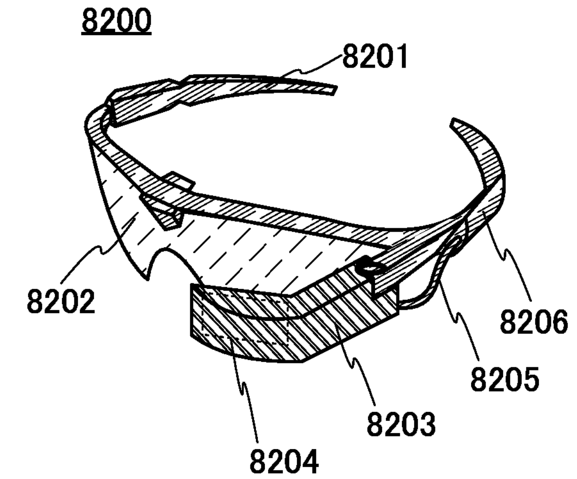
FIG. 18C
FIG. 18D
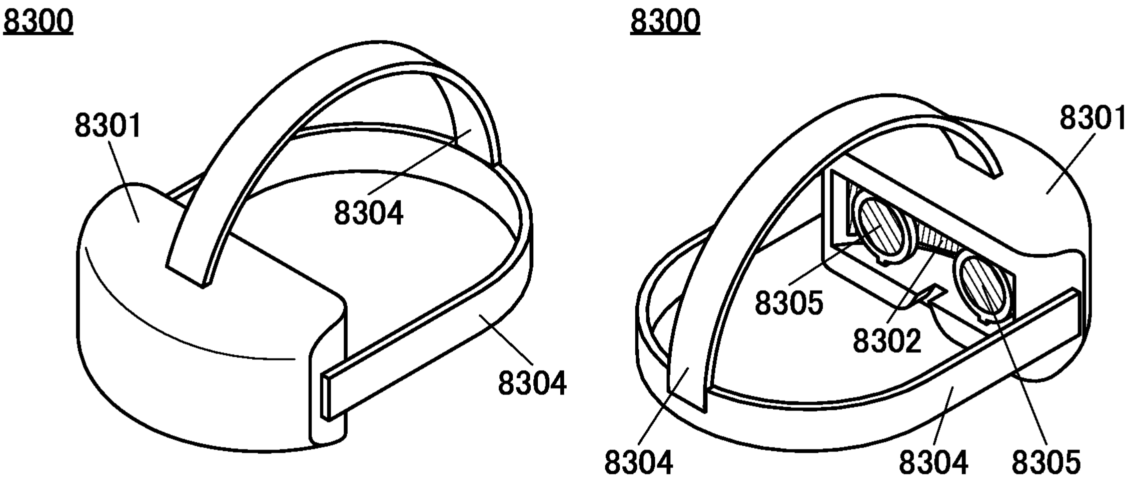
FIG. 18E
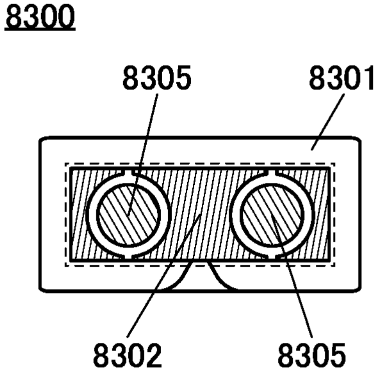
FIG. 18F
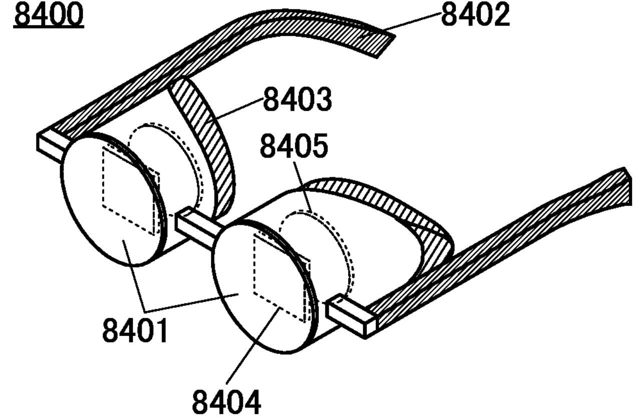

9101
9001
9050
9051
9005
9000

9102
9053
9052
9001
9000
9054

9200
9001
9000
9007
19:34
9005
9008
9003
9006
9005

9201
9001
9055
9000

9201
9001
9055
9000

9201
9055
9000
9001

DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with an increase in definition. An example of a device required to have the highest resolution is a device for virtual reality (VR) or augmented reality (AR).

Typical examples of display devices that can be used in display panels include a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

Patent Document 2 discloses a display device using an organic EL device for VR.

REFERENCE

Patent Document

[Patent Document 1] Japanese Published Patent Application No. 2002-324673

[Patent Document 2] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a display device that can easily achieve higher resolution. An object of one embodiment of the present invention is to provide a display device with both high display quality and high resolution. An object of one embodiment of the present invention is to provide a display device with high contrast.

An object of one embodiment of the present invention is to provide a display device having a novel structure or a method for manufacturing a display device. An object of one embodiment of the present invention is to provide a method for manufacturing the above-described display device with high yield. An object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a display device that includes a first conductive layer, a first insulating layer over the first conductive layer, a second conductive layer including a first region over the first insulating layer and a second region in an opening provided in the first insulating layer, a second insulating layer over the first insulating layer, a third insulating layer over the second region, an EL layer including a third region over the first region, a fourth region over the second insulating layer, and a fifth region over the third insulating layer, and a third conductive layer over the EL layer. The opening is provided in the first insulating layer so as to reach a top surface of the first conductive layer. A top surface of the first region, a top surface of the second insulating layer, and a top surface of the third insulating layer are substantially level with each other.

In the above structure, an end portion of the second conductive layer is preferably in contact with a bottom surface of the EL layer.

In the above structure, the EL layer is preferably in contact with the second insulating layer and the third insulating layer.

Another embodiment of the present invention is a display device that includes a first conductive layer, a second conductive layer, a first insulating layer over the first conductive layer and the second conductive layer, a first light-emitting element, a second light-emitting element, and a second insulating layer between the first light-emitting element and the second light-emitting element. The first light-emitting element includes a third conductive layer including a first region over the first insulating layer and a second region in a first opening provided in the first insulating layer, a third insulating layer over the second region, and a first EL layer including a third region over the first region, a fourth region over the second insulating layer, and a fifth region over the third insulating layer. The second light-emitting element includes a fourth conductive layer including a sixth region over the first insulating layer and a seventh region in a second opening provided in the first insulating layer, a fourth insulating layer over the seventh region, and a second EL layer including an eighth region over the sixth region, a ninth region over the second insulating layer, and a tenth region over the fourth insulating layer. The first opening is provided in the first insulating layer so as to reach a top surface of the first conductive layer. The second opening is provided in the first insulating layer so as to reach a top surface of the second conductive layer. A top surface of the first region, a top surface of the second insulating layer, a top surface of the third insulating layer, and a top surface of the fourth insulating layer are substantially level with each other.

In the above structure, a fifth conductive layer is preferably included. The fifth conductive layer preferably overlaps with the first EL layer and the second EL layer. The fifth conductive layer preferably functions as an upper electrode of the first light-emitting element and an upper electrode of the second light-emitting element.

In the above structure, an end portion of the third conductive layer is preferably in contact with a bottom surface of the first EL layer, and an end portion of the fourth conductive layer is preferably in contact with a bottom surface of the second EL layer.

In the above structure, the first EL layer is preferably in contact with the second insulating layer and the third insulating layer, and the second EL layer is preferably in contact with the second insulating layer and the fourth insulating layer.

Effect of the Invention

With one embodiment of the present invention, a display device with high display quality can be provided. A highly reliable display device can be provided. A display device with low power consumption can be provided. A display device that can easily achieve a higher resolution can be provided. A display device with both high display quality and high resolution can be provided. A display device with high contrast can be provided.

With one embodiment of the present invention, a display device having a novel structure or a method for manufacturing a display device can be provided. A method for manufacturing the above-described display device with high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 12 is a cross-sectional view illustrating an example of a display device.

FIG. 17A to FIG. 17D are diagrams illustrating examples of electronic devices.

FIG. 18A to FIG. 18F are diagrams illustrating examples of electronic devices.

MODE FOR CARRYING OUT THE INVENTION

Figure 1A:
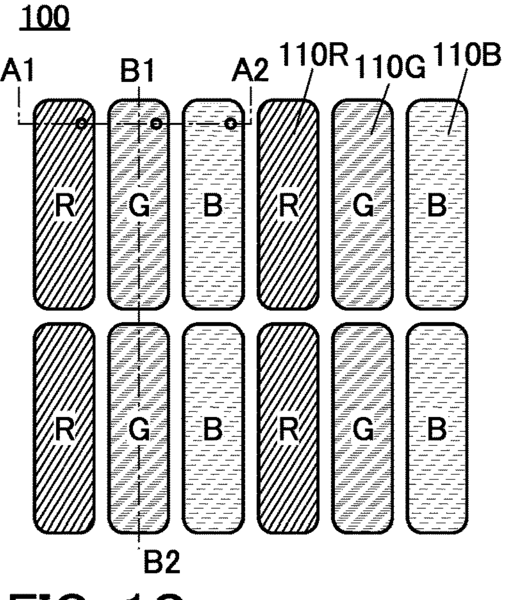
FIG. 1A to FIG. 1D are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first,” “second,” and the like are used in order to avoid confusion among components and do not limit the number.

In this specification and the like, the term “film” and the term “layer” can be interchanged with each other. For example, in some cases, the term “conductive layer” and the term “insulating layer” can be interchanged with the term “conductive film” and the term “insulating film,” respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the light-emitting layer and the layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

In this specification and the like, a device formed using a metal mask or an FMM (fine metal mask, high-resolution mask) may be referred to as a device having an MM (metal mask) structure. In this specification and the like, a device formed without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, an intermediate layer such as a charge-generation layer is preferably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Embodiment 1

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements that emit light of different colors. The light-emitting elements each include a pair of electrodes and an EL layer between them. As the light-emitting elements, electroluminescent elements such as organic EL elements or inorganic EL elements can be used. Besides, light-emitting diodes (LEDs) can be used. The light-emitting elements of one embodiment of the present invention are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

Here, as a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and a high aperture ratio. In addition, dust derived from a material attached to the metal mask in evaporation is generated in some cases. Such dust might cause defective patterning of the light-emitting elements. In addition, a short circuit derived from the dust may occur. A step of cleaning the material attached to the metal mask is necessary. Thus, a measure has been taken for pseudo improvement in resolution (also referred to pixel density) by, for example, employing a unique pixel arrangement such as a PenTile arrangement.

In one embodiment of the present invention, fine patterning of an EL layer is performed without a shadow mask such as a metal mask. With this, a display device with high resolution and a high aperture ratio, which has been difficult to achieve, can be fabricated. Moreover, EL layers can be formed separately, enabling the display device to perform extremely clear display with high contrast and high display quality.

Here, a description is made on a case where EL layers in light-emitting elements of two colors are separately formed, for simplicity. First, a stack of a first EL film and a first sacrificial film is formed to cover a conductive film to be pixel electrodes. Next, a resist mask is formed over the first sacrificial film. Then, part of the first sacrificial film and part of the first EL film are etched using the resist mask, so that a first EL layer and a first sacrificial layer over the first EL layer are formed.

Next, a stack of a second EL film and a second sacrificial film is formed. Then, part of the second sacrificial film and part of the second EL film are etched using the resist mask, so that a second EL layer and a second sacrificial layer over the second EL layer are formed. Next, the conductive film to be pixel electrodes is processed using the first sacrificial layer and the second sacrificial layer as a mask, so that a first pixel electrode overlapping with the first EL layer and a second pixel electrode overlapping with the second EL layer are formed. In this manner, the first EL layer and the second EL layer can be formed separately. Finally, the first sacrificial layer and the second sacrificial layer are removed and a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three colors or four or more colors can be achieved.

At an end portion of the EL layer, a step is generated owing to a region where the pixel electrode and the EL layer are provided and a region where the pixel electrode and the EL layer are not provided. At the time of forming the common electrode over the EL layer, coverage with the common electrode is degraded owing to the step at the end portion of the EL layer, which might cause disconnection of the common electrode. Furthermore, the common electrode becomes thinner, whereby electric resistance might be increased.

In the case where an end portion of the pixel electrode is substantially aligned with the end portion of the EL layer or the case where the end portion of the pixel electrode is positioned on an outer side than the end portion of the EL layer, the common electrode and the pixel electrode are sometimes short-circuited when the common electrode is formed over the EL layer.

In one embodiment of the present invention, an insulating layer is provided between the first EL layer and the second EL layer, whereby unevenness on the surface where the common electrode is provided can be reduced. Thus, the coverage with the common electrode can be increased at the end portion of the first EL layer and the end portion of the second EL layer, which allows favorable conductivity of the common electrode. In addition, a short circuit between the common electrode and the pixel electrode can be inhibited.

Moreover, in one embodiment of the present invention, the sacrificial layer is formed using a resist mask, and the EL layer and the pixel electrode can be processed using the formed sacrificial layer; thus, a light-emitting element can be formed without use of different resist masks for processing the pixel electrode and processing the EL layer. Accordingly, a margin for the positions of the end portions of the pixel electrode and the EL layer is not necessarily provided for forming a light-emitting element. With a reduction in the margin for the positions, a light-emitting region can be extended, whereby the aperture ratio of the light-emitting element can be increased. Moreover, with a reduction in the margin for the positions, a reduction in the pixel size is possible, whereby the display device can have higher resolution. Furthermore, the number of uses of the resist masks can be reduced, whereby the process can be simplified. This enables a reduction in cost and an improvement in yield.

In the case where EL layers for different colors are adjacent to each other, it is difficult to set the distance between the EL layers adjacent to each other to be less than 10 μm with a formation method using a metal mask, for example; however, with use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile arrangement; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

More specific examples of the structure and manufacturing method of the display device of one embodiment of the present invention are described below with reference to drawings.

The display device of one embodiment of the present invention includes a first layer in which a first conductor is provided, a first insulator over the first layer, a second conductor part of which is provided in an opening portion in the first insulator, and a light-emitting element over the second conductor. Note that the second conductor may function as part of the light-emitting element. The second conductor functions as, for example, a lower electrode of the light-emitting element. A semiconductor element is provided in the first layer, for example. Examples of the semiconductor element include a transistor, a diode, and a capacitor. In the display device of one embodiment of the present invention, a transistor is provided in the first layer, and the first conductor functions as a source electrode, a drain electrode, or a gate electrode included in the transistor. Alternatively, in the display device of one embodiment of the present invention, the first conductor is electrically connected to the semiconductor element provided in the first layer. The first conductor functions as, for example, a wiring, an electrode, or the like.

Structure Example 1

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

Figure 1B:
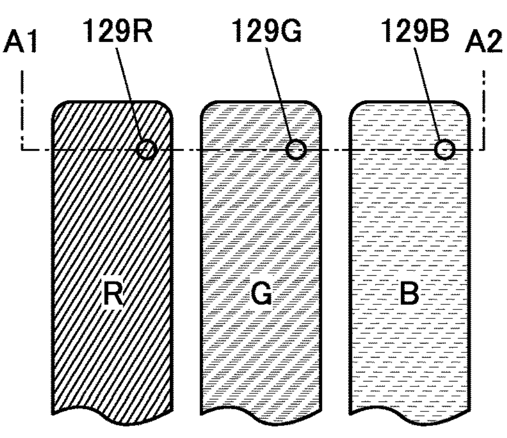

FIG. 1B is an enlarged view of part of FIG. 1A. The light-emitting element 110R overlaps with an opening portion 129R, the light-emitting element 110G overlaps with an opening portion 129G, and the light-emitting element 110B overlaps with an opening portion 129B. The opening portion 129R, the opening portion 129G, and the opening portion 129B are each provided in an insulating layer 255 described later.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement or a zigzag arrangement may be used or a PenTile arrangement may also be used.

Figure 7:
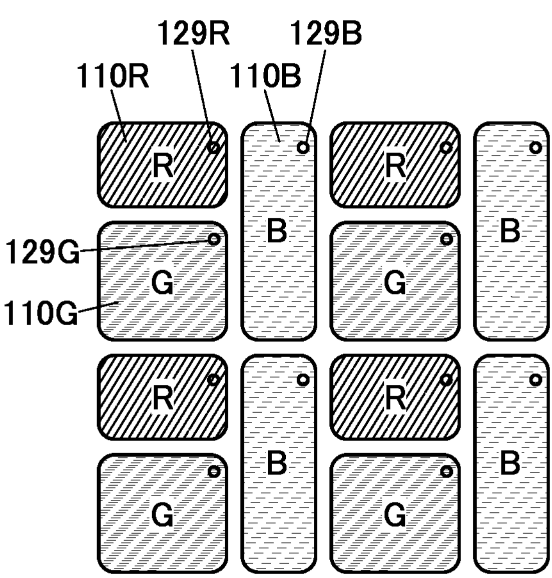
FIG. 7 is a diagram illustrating a structure example of a display device.

The arrangement illustrated in FIG. 7 may be used. The arrangement illustrated in FIG. 7 is called S-stripe arrangement in some cases. In FIG. 7, first-color light-emitting elements (the light-emitting elements 110R in the example illustrated in FIG. 7) and second-color light-emitting elements (the light-emitting elements 110G in the example illustrated in FIG. 7) are alternately arranged in the column direction. A third-color light-emitting element (the light-emitting element 110B in the example illustrated in FIG. 7) includes a region sandwiched between two of the first-color light-emitting elements and a region sandwiched between two of the second-color light-emitting elements. Accordingly, the arrangement illustrated in FIG. 7 includes rows in which the first-color light-emitting elements and the third-color light-emitting elements are alternately arranged and rows in which the second-color light-emitting elements and the third-color light-emitting elements are alternately arranged.

As the light-emitting elements 110R, the light-emitting elements 110G, and the light-emitting element 110B, EL elements such as OLEDs (Organic Light Emitting Diodes) or QLEDs (Quantum-dot Light Emitting Diodes) are preferably used. Examples of light-emitting substances contained in the EL element include a substance that emits fluorescence (a fluorescent material), a substance that emits phosphorescence (a phosphorescent material), an inorganic compound (e.g., a quantum dot material), and a substance that exhibits thermally activated delayed fluorescence (a thermally activated delayed fluorescent (TADF) material).

Figure 1C:
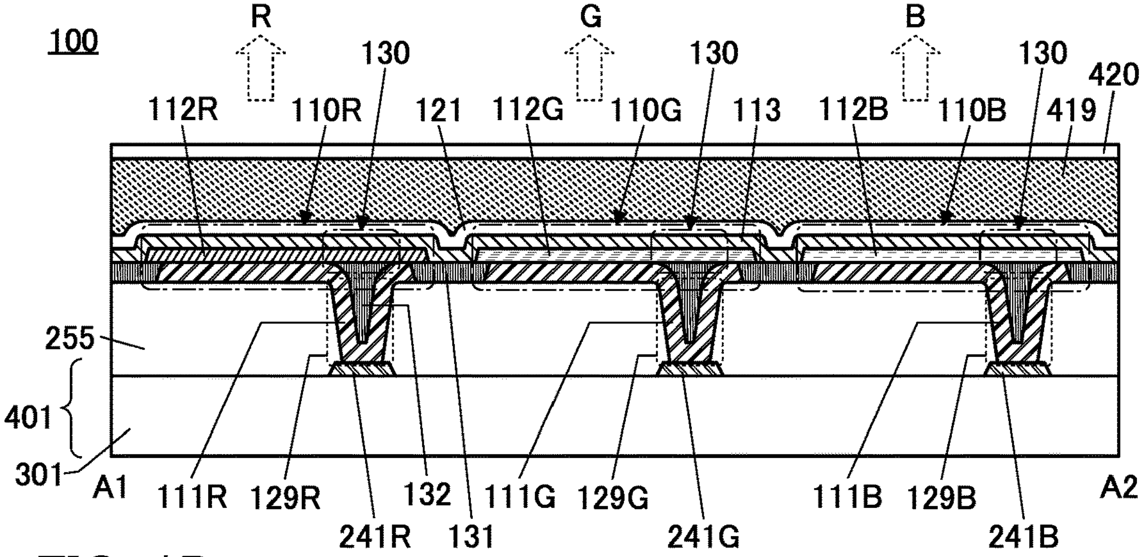
Figure 1D:
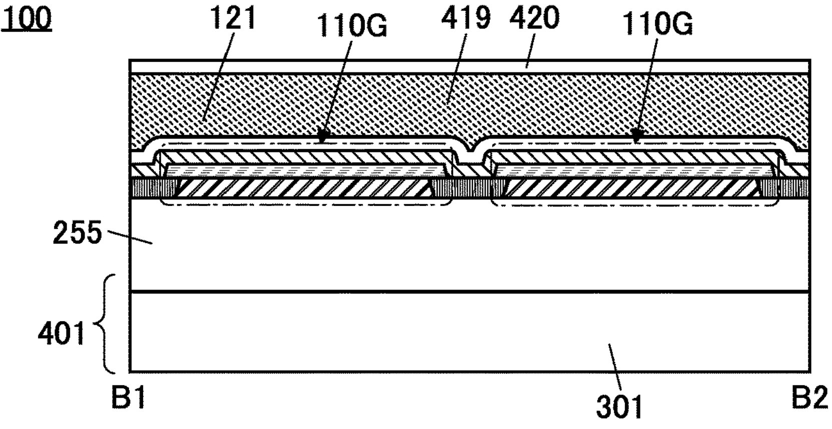

FIG. 1C is a schematic cross-sectional view taken along the dashed-dotted line A1-A2 in FIG. 1A, and FIG. 1D is a schematic cross-sectional view taken along the dashed-dotted line B1-B2.

In the cross-sectional view of FIG. 1C, the light-emitting element 110R, the light-emitting element 110G, and the light-emitting element 110B are provided over a layer 401. The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113.

FIG. 1C illustrates an example in which a conductive layer 241 is provided over a substrate 301 as a simplified example of the layer 401; a semiconductor element is preferably provided in the layer 401. Examples of the semiconductor element include a transistor, a diode, and a capacitor.

Specifically, for example, a transistor is provided in the layer 401 and the conductive layer 241 functions as a source electrode, a drain electrode, or a gate electrode included in the transistor.

Alternatively, for example, the conductive layer 241 is electrically connected to the semiconductor element provided in the layer 401. The conductive layer 241 functions as, for example, a wiring, an electrode, or the like.

The insulating layer 255 is provided over the layer 401 including the conductive layer 241, and an opening portion is provided in the insulating layer 255 over the conductive layer 241. An electrode that functions as a lower electrode of a light-emitting element 110 is provided in the opening portion and over the insulating layer 255. The electrode is preferably provided along a bottom surface and a side surface of the opening portion. The electrode is electrically connected to the conductive layer 241. The electrode is preferably in contact with a top surface of the conductive layer 241 in the opening portion.

In FIG. 1C, a plurality of the conductive layers 241 are provided and are electrically connected to the respective light-emitting elements. In FIG. 1C, the conductive layers 241 electrically connected to the light-emitting element 110R, the light-emitting element 110G, and the light-emitting element 110B are referred to as a conductive layer 241R, a conductive layer 241G, and a conductive layer 241B, respectively.

The insulating layer 255 is provided over the layer 401. In the insulating layer 255, the opening portion 129R, the opening portion 129G, and the opening portion 129B are provided over the conductive layer 241R, the conductive layer 241G, and the conductive layer 241B, respectively.

The pixel electrode 111R is provided in the opening portion 129R and over the insulating layer 255. The pixel electrode 111R is provided along a bottom surface and a side surface of the opening portion 129R. The pixel electrode 111R is electrically connected to the conductive layer 241R. The pixel electrode 111R is preferably in contact with a top surface of the conductive layer 241R.

The pixel electrode 111G is provided in the opening portion 129G and over the insulating layer 255. The pixel electrode 111G is provided along a bottom surface and a side surface of the opening portion 129G. The pixel electrode 111G is electrically connected to the conductive layer 241G. The pixel electrode 111G is preferably in contact with a top surface of the conductive layer 241G.

The pixel electrode 111B is provided in the opening portion 129B and over the insulating layer 255. The pixel electrode 111B is provided along a bottom surface and a side surface of the opening portion 129B. The pixel electrode 111B is electrically connected to the conductive layer 241B. The pixel electrode 111B is preferably in contact with a top surface of the conductive layer 241B.

In the display device of one embodiment of the present invention, the lower electrode (may be called a pixel electrode in FIG. 1C and the like) of the light-emitting element has a depressed portion. An insulating layer 132 is preferably provided so as to be embedded in the depressed portion. The EL layer included in the light-emitting element preferably includes a first region in contact with a top surface of the lower electrode and a second region in contact with a top surface of the insulating layer 132 in the depressed portion. The top surface of the lower electrode in contact with the first region and the top surface of the insulating layer 132 in contact with the second region are preferably substantially level with each other.

The common electrode is provided over the EL layer. The common electrode is provided as a continuous layer shared by the plurality of light-emitting elements.

As illustrated in FIG. 1C, the pixel electrodes 111 (the pixel electrode 111R, the pixel electrode 111G, and the pixel electrode 111B) included in the light-emitting element 110R, the light-emitting element 110G, and the light-emitting element 110B are each formed along the bottom surface and the side surface of the opening portion provided in the insulating layer 255. Thus, the top surface of the pixel electrode included in each of the light-emitting elements has the depressed portion along the opening portion. In the case where the EL layer is provided over the pixel electrode and the common electrode is provided over the EL layer, the coverage with the EL layer is degraded due to the step between a bottom surface of the depressed portion and a region in the outer periphery of the depressed portion, which might cause thickness reduction of the EL layer. In such a case, a short circuit between the lower electrode and the common electrode might be caused. Moreover, the coverage with the common electrode is degraded due to the step, which might cause disconnection of the common electrode or cause thickness reduction of the common electrode, resulting in high resistance, for example.

In the display device of one embodiment of the present invention, providing the insulating layer 132 over the pixel electrode in the depressed portion of the pixel electrode in the light-emitting element can make the step small and improve the coverage with the EL layer and the coverage with the common electrode.

Here, the insulating layer 132 is provided over the pixel electrode, whereby the EL layer included in the light-emitting element includes the first region in contact with the top surface of the lower electrode and the second region in contact with the top surface of the insulating layer in the depressed portion, for example. In the second region, the EL layer is not electrically connected to the lower electrode and is thus a non-light-emitting region. The proportion of the second region in the EL layer is preferably reduced to increase the aperture ratio of the light-emitting element. Therefore, the proportion of a region in the pixel electrode covered with the insulating layer 132 is preferably small.

A region 130 illustrated in FIG. 1C is a region where the EL layer is not electrically connected to the lower electrode in each of the light-emitting elements and thus can be a non-light-emitting region.

It is preferable that the pixel electrode over a flat region of the insulating layer 255 in which the opening portion is not provided, for example, a region in the periphery of the depressed portion of the pixel electrode be not covered with the insulating layer 132. Such a structure can reduce the area of the non-light-emitting region of the light-emitting element.

In the display device of one embodiment of the present invention, the top surface of the insulating layer 132 is made to be substantially level with or slightly lower (e.g., by the amount equivalent to 0.3 times or less the thickness of the pixel electrode) than the pixel electrode over the flat region of the insulating layer 255, for example, the region in the periphery of the depressed portion of the pixel electrode, whereby the area of the pixel electrode that is covered with the insulating layer 132 can be reduced. Accordingly, the aperture ratio of the display device can be increased.

In the light-emitting element 110R, the EL layer 112R includes a first region in contact with a top surface of the pixel electrode 111R and a second region in contact with the top surface of the insulating layer 132. A bottom surface of the first region and a bottom surface of the second region are preferably substantially level with each other. Alternatively, in the case where the bottom surface of the first region and the bottom surface of the second region are not substantially level with each other, the bottom surface of the second region is preferably lower than the bottom surface of the first region. The difference in level between the bottom surface of the first region and the bottom surface of the second region is preferably 0.3 times or less the thickness of the pixel electrode 111R. In the first region, the EL layer 112R is sandwiched between the pixel electrode 111R and the common electrode 113. In the first region, the EL layer 112R is preferably in contact with the top surface of the pixel electrode 111R.

Here, the level of the bottom surface of the EL layer can refer to, for example, the lowest part in a region. Alternatively, the level of the bottom surface of the EL layer can refer to, for example, the average of levels in the region.

In the light-emitting element 110G, the EL layer 112G includes a first region in contact with a top surface of the pixel electrode 111G and a second region in contact with the top surface of the insulating layer 132. A bottom surface of the first region and a bottom surface of the second region are preferably substantially level with each other. Alternatively, the difference in level between the bottom surface of the first region and the bottom surface of the second region is preferably 0.3 times or less the thickness of the pixel electrode 111G. Alternatively, the bottom surface of the second region is preferably lower than the bottom surface of the first region. In the first region, the EL layer 112G is sandwiched between the pixel electrode 111G and the common electrode 113. In the first region, the EL layer 112G is preferably in contact with the top surface of the pixel electrode 111G.

In the light-emitting element 110B, the EL layer 112B includes a first region in contact with a top surface of the pixel electrode 111B and a second region in contact with the top surface of the insulating layer 132. A bottom surface of the first region and a bottom surface of the second region are preferably substantially level with each other. Alternatively, the difference in level between the bottom surface of the first region and the bottom surface of the second region is preferably 0.3 times or less the thickness of the pixel electrode 111B. Alternatively, the bottom surface of the second region is preferably lower than the bottom surface of the first region. In the first region, the EL layer 112B is sandwiched between the pixel electrode 111B and the common electrode 113. In the first region, the EL layer 112B is preferably in contact with the top surface of the pixel electrode 111B.

The EL layer 112R contains at least a light-emitting organic compound that emits light with intensity in the red wavelength range. The EL layer 112G contains at least a light-emitting organic compound that emits light with intensity in the green wavelength range. The EL layer 112B contains at least a light-emitting organic compound that emits light with intensity in the blue wavelength range.

The EL layer 112R, the EL layer 112G, and the EL layer 112B each include a layer containing a light-emitting organic compound (light-emitting layer). The light-emitting layer may contain one or more kinds of compounds (a host material and an assist material) in addition to the light-emitting substance (a guest material). As the host material and the assist material, one or more kinds of substances having a larger energy gap than the light-emitting substance (the guest material) can be selected and used. As the host material and the assist material, compounds that form an exciplex are preferably used in combination. To form an exciplex efficiently, it is particularly preferable to combine a compound that easily accepts holes (hole-transport material) and a compound that easily accepts electrons (electron-transport material).

Either a low molecular compound or a high molecular compound can be used for the light-emitting element, and an inorganic compound (e.g., quantum dot material) may also be contained.

The EL layer 112R, the EL layer 112G, and the EL layer 112B may each include one or more of an electron-injection layer, an electron-transport layer, a hole-injection layer, and a hole-transport layer in addition to the light-emitting layer.

The pixel electrode 111R, the pixel electrode 111G, and the pixel electrode 111B are provided for the respective light-emitting elements. The common electrode 113 is provided as a continuous layer shared by the light-emitting elements. A conductive film that has a property of transmitting visible light is used for either the pixel electrodes or the common electrode 113, and a reflective conductive film is used for the other. When the pixel electrodes are light-transmitting electrodes and the common electrode 113 is a reflective electrode, a bottom-emission display device can be obtained; in contrast, when the respective pixel electrodes are reflective electrodes and the common electrode 113 is a light-transmitting electrode, a top-emission display device can be obtained. Note that when both the pixel electrodes and the common electrode 113 transmit light, a dual-emission display device can be obtained.

A protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure including at least an inorganic insulating film. Examples of the inorganic insulating film include oxide films and nitride films such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This structure enables the top surface of the organic insulating film to be flat, and accordingly, coverage with the inorganic insulating film thereover is improved, leading to an improvement in barrier properties. Moreover, a top surface of the protective layer 121 is flat; therefore, when a component (e.g., a color filter, an electrode of a touch sensor, a lens array, or the like) is provided above the protective layer 121, the component is less affected by an uneven shape caused by the lower structure.

A substrate 420 is bonded to the top surface of the protective layer 121 with a resin layer 419.

In the cross section illustrated in FIG. 1D, two of the light-emitting elements 110G are provided adjacent to each other. The conductive layer 241 is not provided in the layer 401, and the insulating layer 255 is not provided with an opening portion overlapping with the conductive layer 241. Thus, the pixel electrode 111G included in the light-emitting element 110G is provided in a flat region of the insulating layer 255.

An insulating layer 131 may be provided between the adjacent light-emitting elements 110. In FIG. 1C, the insulating layer 131 is positioned between the EL layers 112 included in the light-emitting elements 110. The common electrode 113 is provided over the insulating layer 131.

The insulating layer 131 is provided, for example, between two EL layers 112 exhibiting different colors. Alternatively, the insulating layer 131 is provided, for example, between two EL layers 112 exhibiting the same color. Alternatively, the following structure may be employed: the insulating layer 131 is provided between two EL layers 112 exhibiting different colors and is not provided between two EL layers 112 exhibiting the same color.

The insulating layer 131 is provided, for example, between two EL layers 112 in a top view.

It is preferable that the EL layer 112R, the EL layer 112G, and the EL layer 112B each include a region in contact with the top surface of the pixel electrode 111 and a region in contact with the top surface of the insulating layer 131. The end portions of the EL layer 112R, the EL layer 112G, and the EL layer 112B are preferably in contact with the top surface of the insulating layer 131.

When the insulating layer 131 is provided between the light-emitting elements of different colors, the EL layer 112R, the EL layer 112G, and the EL layer 112G can be inhibited from being in contact with each other. This suitably prevents unintentional light emission due to a current flow through two adjacent EL layers. As a result, the contrast can be increased to achieve a display device with high display quality.

The top surface of the insulating layer 131 is preferably substantially level with the top surface of the pixel electrode 111. The top surface of the insulating layer 131 has a flat shape, for example.

The insulating layer 131 is provided, whereby degradation of the coverage with the EL layer 112 and the common electrode 113 due to the step at the end portion of the pixel electrode 111 can be inhibited.

In one embodiment of the present invention, an insulating layer is provided between the first EL layer and the second EL layer, whereby unevenness on the surface where the common electrode is provided can be reduced. Thus, the coverage with the common electrode can be increased, which allows favorable conductivity of the common electrode. In addition, the structure in which the end portion of the pixel electrode is covered with the insulating layer can inhibit a short circuit between the common electrode and the pixel electrode.

The same material is preferably used for the insulating layer 132 and the insulating layer 131. The insulating layer 132 and the insulating layer 131 preferably contain the same material. The insulating layer 132 and the insulating layer 131 preferably contain the same element.

As the insulating layer 131 and the insulating layer 132, an acrylic resin, a polyimide resin, an epoxy resin, a polyamide resin, a polyimide-amide resin, a siloxane resin, a benzocyclobutene-based resin, a phenol resin, and precursors of these resins can be given, for example.

By forming the insulating layer 131 and the insulating layer 132 using the same material, the manufacturing process of the display device of one embodiment of the present invention can be simplified. For example, in the same step, a material for the insulating layer 131 and a material for the insulating layer 132 can be provided. The material for the insulating layer 131 and the material for the insulating layer 132 are provided in the same step, whereby the area of the pixel electrode 111 covered with the insulating layer 131 and the insulating layer 132 can be reduced, for example.

Figures 2A, 2B:
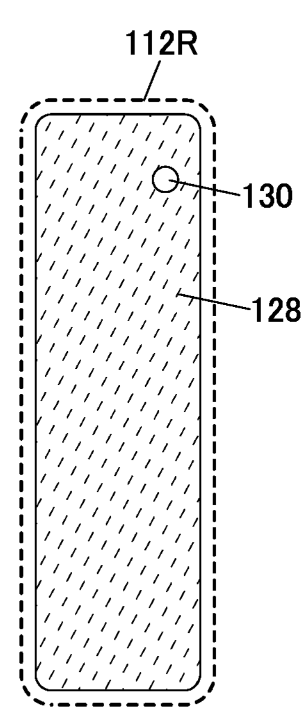
FIG. 2A and FIG. 2B are diagrams illustrating a structure example of a display device.

FIG. 2A is a top view of one light-emitting element. Although the light-emitting element 110R is enlarged in FIG. 2A as an example, the same can apply, as appropriate, to the components included in the light-emitting element 110G and the light-emitting element 110B.

In FIG. 2A, the conductive layer 241R, the pixel electrode 111R, and the opening portion 129R overlap with each other. The pixel electrode 111R is electrically connected to the conductive layer 241R through the opening portion 129R. The EL layer 112R overlaps with the pixel electrode 111R and the opening portion 129R. In FIG. 2A, an end portion of the EL layer 112R is positioned outside an end portion of the pixel electrode 111R.

The conductive layer 241R is preferably electrically connected to the semiconductor element provided in the layer 401. The position and shape of the conductive layer 241R is determined depending on the position of the semiconductor element, for example. For example, the conductive layer 241R overlaps with the semiconductor element. Alternatively, the conductive layer 241R functions as part of the semiconductor element. The opening portion 129R is provided depending on the position of the conductive layer 241R, for example.

FIG. 2B illustrates the EL layer 112R, a region 128, and a region 130 included in the light-emitting element 110R. The region 128 is a light-emitting region of the light-emitting element 110R and is a region where the EL layer 112R, the pixel electrode 111R, and the common electrode 113 overlap with each other. The region 130 is a region that overlaps with the opening portion 129R and can be a non-light-emitting region.

The region 130 can be a non-light-emitting region. Thus, when the position of the region 130 is changed, the position of the non-light-emitting region is also changed in some cases. However, in the display device of one embodiment of the present invention, the area of the non-light-emitting region can be extremely small; thus, the display quality of the display device is less affected by change of the position of the region 130. Thus, the display quality of the display device is less affected even when the position of the opening portion 129R is changed.

Figure 3A:
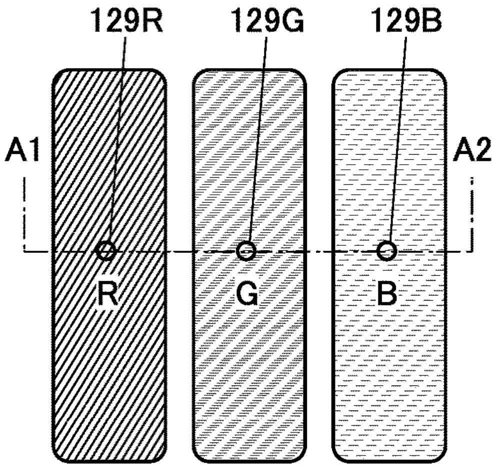
FIG. 3A and FIG. 3B are diagrams illustrating a structure example of a display device.
Figure 3B:
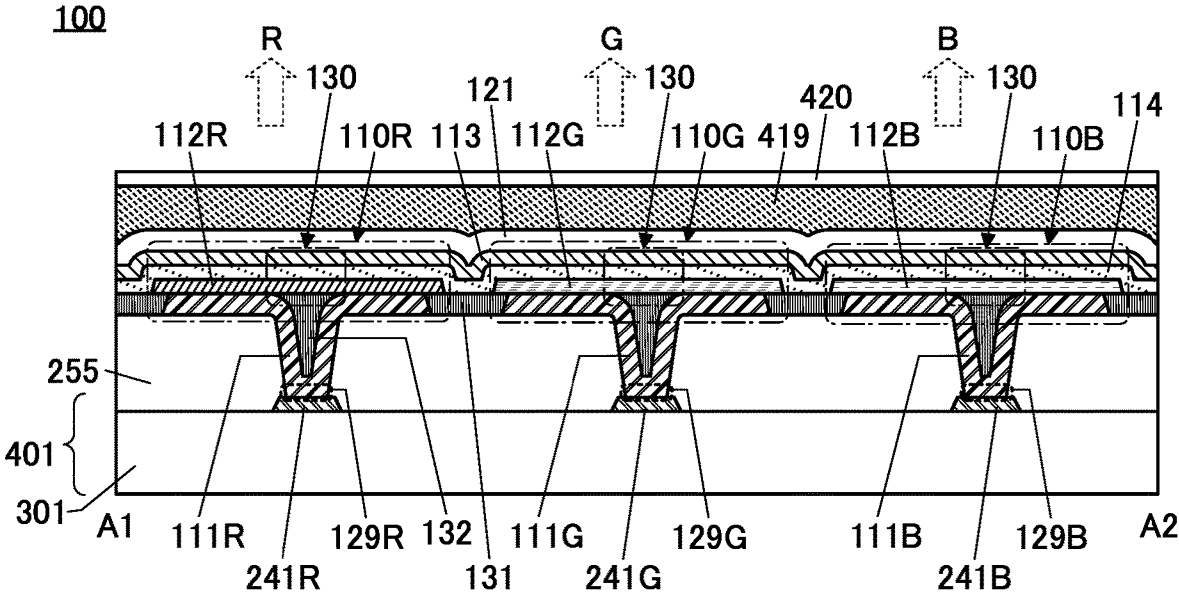

FIG. 3A illustrates an example in which the opening portion 129R, the opening portion 129G, and the opening portion 129B are positioned in the center of the light-emitting elements. FIG. 3B is a schematic cross-sectional view taken along the dashed-dotted line A1-A2 in FIG. 3A.

In the display device of one embodiment of the present invention, the degree of layout flexibility of the opening portion 129R is high; therefore, the degree of layout flexibility of the conductive layer 241 provided in the layer 401 is also high. Since the degree of layout flexibility of the conductive layer 241 is high, the degree of layout flexibility of the semiconductor element provided in the layer 401 can also be high in some cases.

When the degree of layout flexibility of the semiconductor element provided in the layer 401 is increased, the performance of the semiconductor element included in the layer 401 can be improved in some cases. Alternatively, power consumption of the semiconductor element can be reduced in some cases. Alternatively, the area of the semiconductor element can be reduced in some cases.

Alternatively, the performance of a circuit using the semiconductor element included in the layer 401 can be improved in some cases. Alternatively, the power consumption of the circuit can be reduced in some cases.

Alternatively, when the degree of layout flexibility of a plurality of semiconductor elements included in a circuit included in the layer 401 is increased, the area of the circuit can be reduced in some cases.

Note that the light-emitting element 110 may include, as illustrated in FIG. 3B, a common layer 114 between the EL layer 112 and the common electrode 113.

Like the common electrode 113, the common layer 114 is provided across a plurality of light-emitting elements. The common layer 114 is provided to cover the EL layer 112R, the EL layer 112G, and the EL layer 112B. The manufacturing process can be simplified by including the common layer 114, reducing the manufacturing cost. The common layer 114 and the common electrode 113 can be formed successively without an etching step or the like between formations of the common layer 114 and the common electrode 113. Thus, the interface between the common layer 114 and the common electrode can be clean, and the light-emitting element can have favorable characteristics.

The common layer 114 is preferably in contact with one or more of the top surfaces of the EL layer 112R, the EL layer 112G, and the EL layer 112B.

Each of the EL layer 112R, the EL layer 112G, and the EL layer 112B preferably includes at least a light-emitting layer containing a light-emitting material emitting light of one color, for example. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

Structure Example 2

Figure 4A:
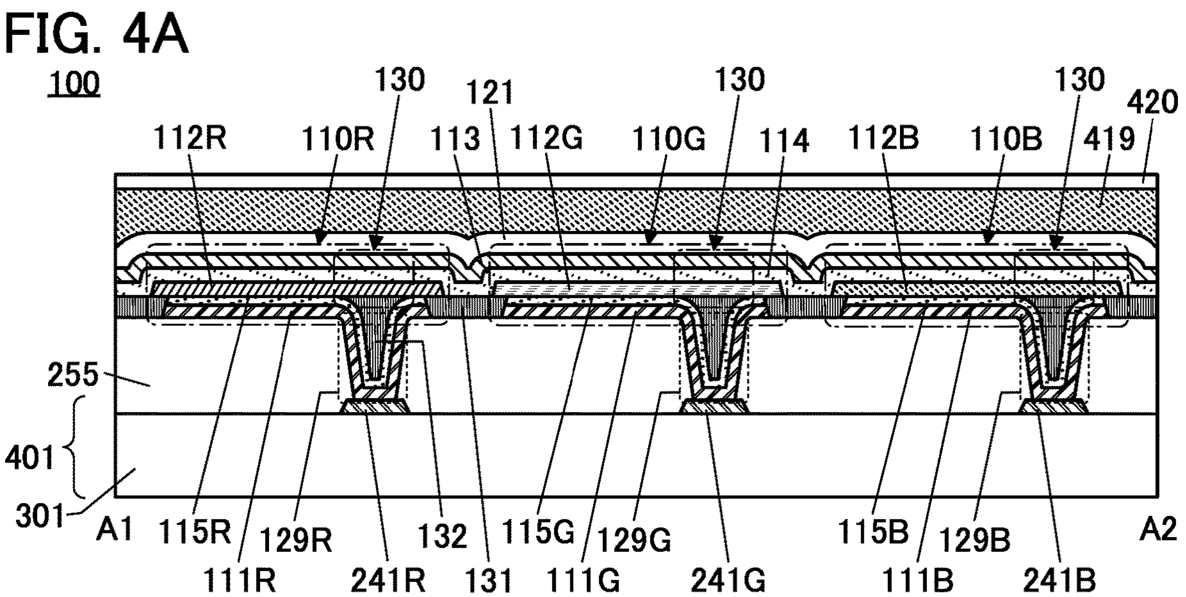
FIG. 4A and FIG. 4B are diagrams each illustrating a structure example of a display device.

The display device 100 illustrated in FIG. 4A is different from that in FIG. 1B mainly in that an optical adjustment layer 115 is included and that the common layer 114 is included.

In FIG. 4A, an optical adjustment layer 115R is provided so as to be sandwiched between the pixel electrode 111R and the EL layer 112R, an optical adjustment layer 115G is provided so as to be sandwiched between the pixel electrode 111G and the EL layer 112G, and an optical adjustment layer 115B is provided so as to be sandwiched between the pixel electrode 111B and the EL layer 112B. Moreover, in FIG. 4A, the insulating layer 132 is provided between the optical adjustment layer 115R and the EL layer 112R, between the optical adjustment layer 115G and the EL layer 112G, and between the optical adjustment layer 115B and the EL layer 112B.

The optical adjustment layer 115 is provided so as to cover the pixel electrode 111 provided along the bottom surface and the side surface of the opening portion provided in the insulating layer 255. The optical adjustment layer 115 is provided over the depressed portion of the pixel electrode 111 along the depressed portion.

An end surface of the optical adjustment layer 115 is preferably in contact with the insulating layer 131. The insulating layer 131 is provided between a plurality of the optical adjustment layers 115.

In each light-emitting element, a layer that has a property of transmitting visible light is provided as the optical adjustment layer 115, whereby the optical path length can be adjusted. The thickness of the optical adjustment layer 115 may vary among the light-emitting elements, for example. The optical path length may be adjusted by forming the EL layers 112 in the light-emitting elements to have different thicknesses. The optical path length in each light-emitting element corresponds to, for example, the sum of the thickness of the optical adjustment layer 115 and the thickness of the EL layer 112.

The optical path lengths of the light-emitting elements are set different from each other using a microcavity structure, whereby light of a specific wavelength can be intensified. This enables a display device with increased color purity.

For example, the thickness of the EL layer 112 is set different among the light-emitting elements, whereby a micorcavity structure can be obtained. For example, the EL layer 112R of the light-emitting element 110R emitting light whose wavelength is the longest can be made to have the largest thickness, and the EL layer 112B of the light-emitting element 110B emitting light whose wavelength is the shortest can be made to have the smallest thickness. Without limitation to this, the thickness of each EL layer can be adjusted in consideration of the wavelength of light emitted by the light-emitting element, the optical characteristics of the layer included in the light-emitting element, the electrical characteristics of the light-emitting element, and the like.

For example, by using a layer transmitting visible light as the optical adjustment layer, the optical path length can be set different among the light-emitting elements.

As the optical adjustment layer 115, a conductive material that transmits visible light can be used, for example. For example, a conductive oxide such as indium oxide, indium tin oxide, indium zinc oxide, zinc oxide, zinc oxide containing gallium, indium-tin oxide containing silicon, or indium zinc oxide containing silicon can be used.

The optical adjustment layers can be formed after the formation of the pixel electrode 111R, the pixel electrode 111G, and the pixel electrode 111B and before the formation of an EL film 112Rf or the like. The optical adjustment layers are formed to have different thicknesses, whereby the optical path length can differ among the light-emitting elements. The optical adjustment layers may be formed using conductive films with different thicknesses from each other or may have a single-layer structure, a two-layer structure, or a three-layer structure, in ascending order of thickness.

Alternatively, the optical adjustment layer and the EL layer formed to have a different thickness for each color may be used in combination.

Note that a material that is less likely to change in quality in formation of the EL layer 112 is preferably used for the optical adjustment layer 115. A material that is less likely to be oxidized is preferably used for the optical adjustment layer 115. The oxide materials given above are preferably used for the optical adjustment layer 115 owing to their high oxidation resistance.

For simplicity's sake, the thickness of the optical adjustment layer 115 and the thickness of the EL layer 112 are each not distinctly different for each light-emitting element in FIG. 1C, FIG. 3B, FIG. 4A, and the like; however, as described above, to adjust the optical path length, the thicknesses are preferably adjusted as appropriate for each light-emitting element and light with a wavelength corresponding to each light-emitting element is preferably intensified.

In FIG. 4A, the EL layer 112 includes a first region in contact with a top surface of the optical adjustment layer 115 and a second region in contact with a top surface of the insulating layer 132. A bottom surface of the first region and a bottom surface of the second region are preferably substantially level with each other. Alternatively, the difference in level between the bottom surface of the first region and the bottom surface of the second region is preferably 0.3 times or less the sum of the thickness of the optical adjustment layer 115 and the thickness of the pixel electrode 111. Alternatively, the bottom surface of the second region is preferably lower than the bottom surface of the first region. In the first region, the EL layer 112 is sandwiched between the optical adjustment layer 115 and the common electrode 113. In the first region, the EL layer 112 is preferably in contact with the top surface of the optical adjustment layer 115.

Note that a structure in which an end portion of the optical adjustment layer 115 and an end portion of the pixel electrode 111 are not aligned with each other may be employed. The end portion of the optical adjustment layer 115 may be positioned outside the pixel electrode 111. Alternatively, the end portion of the optical adjustment layer 115 may be positioned inside the pixel electrode 111.

Figure 4B:
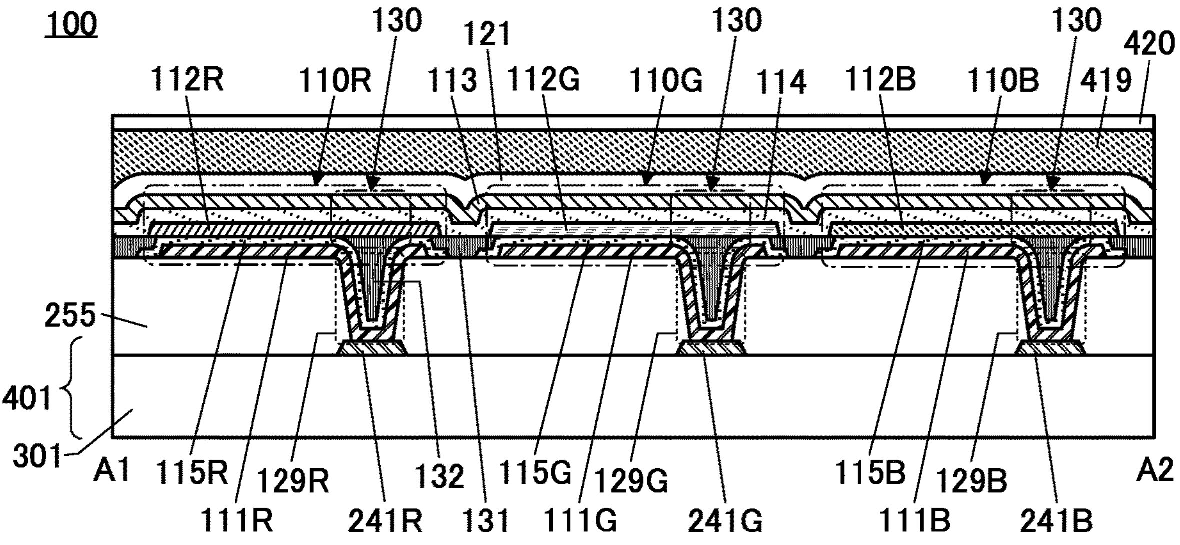
Figure 5A:
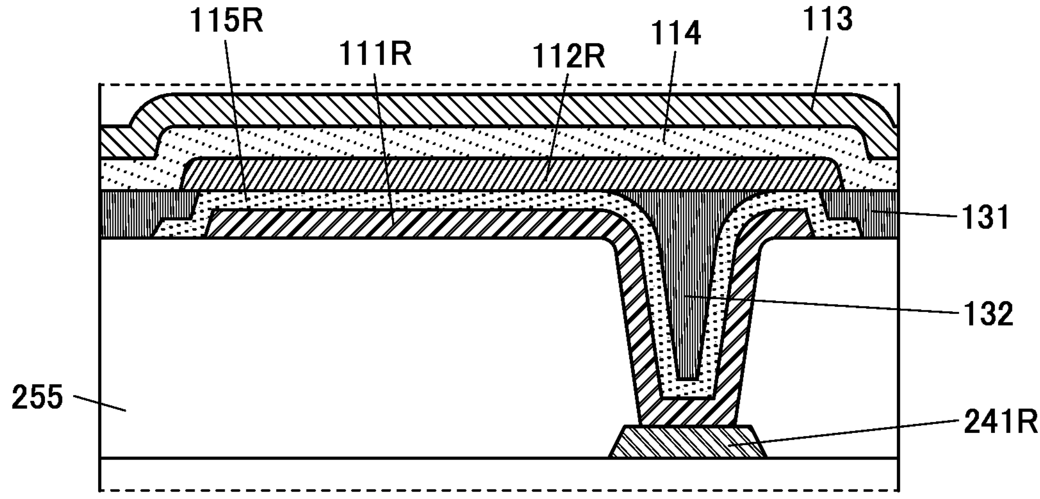
FIG. 5A and FIG. 5B are diagrams each illustrating a structure example of a display device.

The structure illustrated in FIG. 4B shows an example in which the end portion of the optical adjustment layer 115 is positioned outside the end portion of the pixel electrode 111. FIG. 5A is an enlarged view of a region including the light-emitting element 110R in FIG. 4B. An end portion of the optical adjustment layer 115R is positioned outside an end portion of the pixel electrode 111R. An end surface of the pixel electrode 111R is covered with the optical adjustment layer 115R.

The end surface of the pixel electrode 111 is covered with the optical adjustment layer 115, whereby oxidation or change in quality of the pixel electrode 111 in the formation process of the insulating layer 132 or the like can be inhibited in some cases.

Figure 5B:
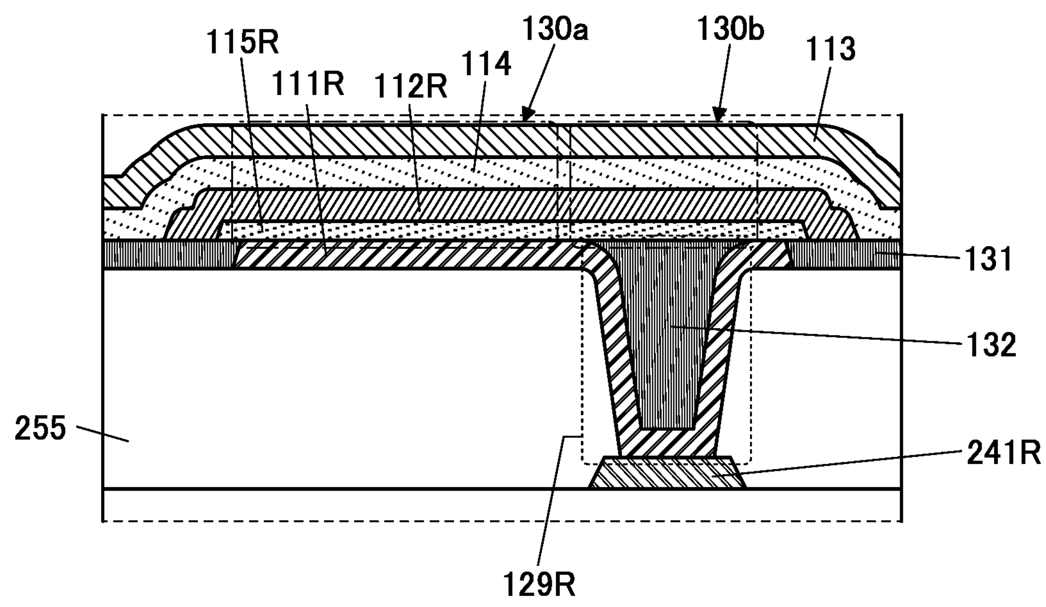

Alternatively, as illustrated in FIG. 5B, the optical adjustment layer 115 may be provided on a top surface of the insulating layer 132. FIG. 5B is an enlarged view of a region including the light-emitting element 110R.

By being formed using a conductive material, the optical adjustment layer 115 can function as one electrode of the light-emitting element even when the optical adjustment layer 115 and the pixel electrode 111 are not stacked.

In FIG. 5B, the optical adjustment layer 115R includes a first region electrically connected to the pixel electrode 111R and a second region including the insulating layer 132 between the optical adjustment layer 115R and the pixel electrode 111R. In the structure illustrated in FIG. 5B, in addition to a region (a region 130*a* hereinafter) over the first region, a region (a region 130*b* hereinafter) over the second region can be a light-emitting region in the light-emitting element 110R. This can increase the aperture ratio of the light-emitting element. Accordingly, the luminance of the light-emitting element can be increased. In addition, the power consumption of the light-emitting element can be reduced in some cases.

Note that the optical path length of light emitted from the EL layer 112R in the region 130*b* is different from that in the region 130*a*. Thus, in the case where the area of the region 130*a* cannot be sufficiently large relative to that of the region 130*b*, the color purity of the light-emitting element 110 may be decreased.

Note that the optical adjustment layer 115 does not necessarily have a function of performing optical adjustment. For example, in the structure illustrated in FIG. 5B, a conductive layer with a low light-transmitting property is used as the optical adjustment layer 115 in some cases. For example, a metal oxide, a metal nitride, or the like is used for the optical adjustment layer 115 in some cases. Examples of the metal nitride include titanium nitride and tantalum nitride.

Structure Example 3

Figure 6A:
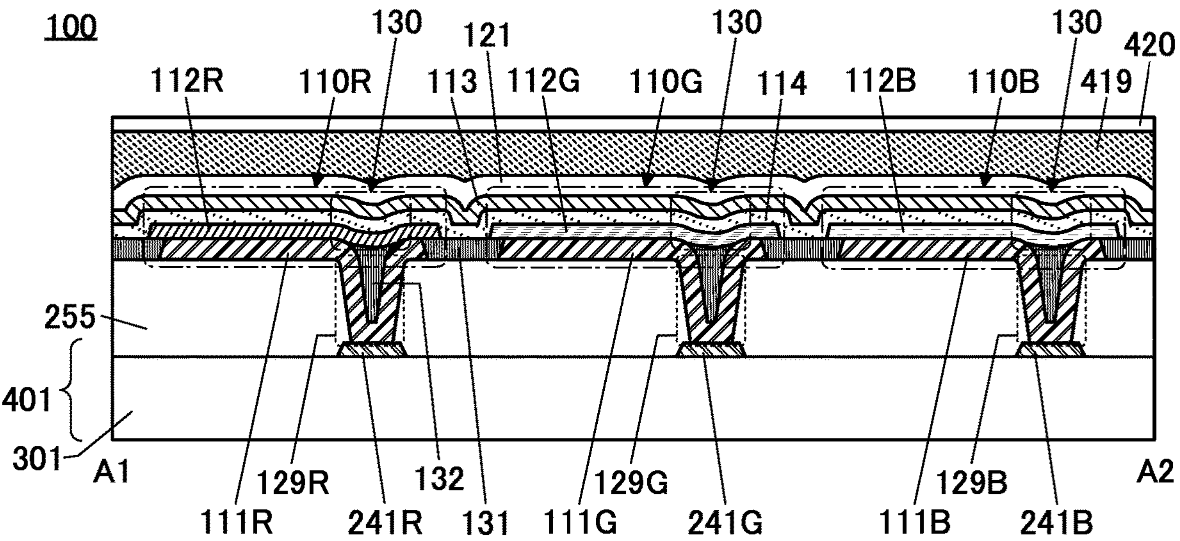
FIG. 6A and FIG. 6B are diagrams each illustrating a structure example of a display device.

The display device 100 illustrated in FIG. 6A is different from that in FIG. 1B mainly in that a top surface of the insulating layer 132 has a concave shape and that the common layer 114 is included.

As illustrated in FIG. 6A, the top surface of the insulating layer 132 has the concave shape in some cases. The top surface of the insulating layer 132 has a gentle concave shape, for example.

Note that although FIG. 6A illustrates an example in which the top surface of the insulating layer 132 has the concave shape, the top surface of the insulating layer 132 may have a convex shape.

Structure Example 4

Figure 6B:
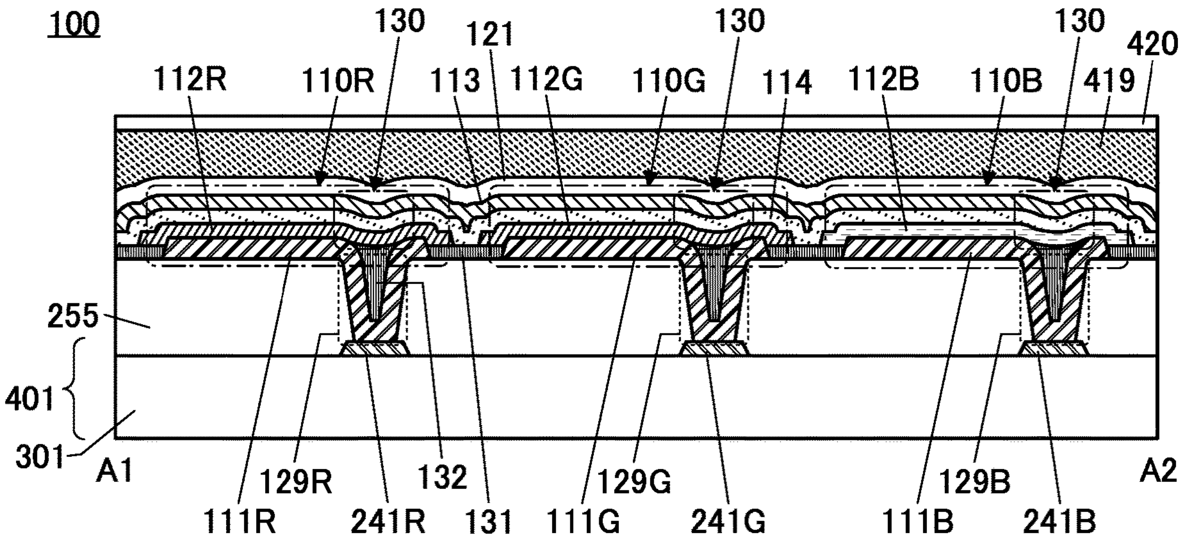

The display device 100 illustrated in FIG. 6B is an example in which a top surface of the insulating layer 131 is lower than a top surface of the pixel electrode 111 and the EL layer 112 covers a step at an end portion of the pixel electrode 111.

The difference in level between the top surface of the insulating layer 131 and a top surface of the end portion of the pixel electrode 111 that is in contact with the insulating layer 131 is preferably small and is preferably, for example, 0.3 times or less the thickness of the pixel electrode 111.

In the case where the display device 100 includes the optical adjustment layer 115 between the EL layer 112 and the pixel electrode 111, the difference in level between the top surface of the insulating layer 131 and a top surface of an end portion of the optical adjustment layer 115 that is in contact with the insulating layer 131 is preferably small and is preferably, for example, 0.3 times or less the sum of the thickness of the pixel electrode 111 and the thickness of the optical adjustment layer 115.

Manufacturing Method Example 1

An example of a method for manufacturing the display device of one embodiment of the present invention is described below with reference to drawings. In the following description, the display device 100 illustrated in FIG. 4A is taken as an example. FIG. 8A to FIG. 10B are schematic cross-sectional views of steps in the method for manufacturing the display device described below as an example.

Note that thin films that constitute the display device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of the thermal CVD method is a metal organic chemical vapor deposition (MOCVD: Metal Organic CVD) method.

Alternatively, thin films that constitute the display device (insulating films, semiconductor films, conductive films, and the like) can be formed by a method such as spin coating, dipping, spray coating, ink-jetting, dispensing, screen printing, offset printing, a doctor knife method, slit coating, roll coating, curtain coating, or knife coating.

When the thin films that constitute the display device are processed, a photolithography method or the like can be used. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. One is a method in which a resist mask is formed over a thin film that is to be processed, the thin film is processed by etching or the like, and the resist mask is removed. The other is a method in which a photosensitive thin film is formed and then the thin film is processed into a desired shape by performing light exposure and development.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by a liquid immersion exposure technique. As the light for the exposure, extreme ultraviolet (EUV) light or X-rays may be used. Furthermore, instead of the light used for the exposure, an electron beam can also be used. Extreme ultraviolet light, X-rays, or an electron beam is preferably used, in which case extremely minute processing can be performed. Note that when light exposure is performed by scanning of a beam such as an electron beam, a photomask is unnecessary.

For etching of the thin film, a dry etching method, a wet etching method, a sandblasting method, or the like can be used.

[Preparation for Substrate 301]

As the substrate 301, a substrate that has heat resistance high enough to withstand at least heat treatment performed later can be used. In the case where an insulating substrate is used as the substrate 301, a glass substrate, a quartz substrate, a sapphire substrate, a ceramic substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used.

Next, a semiconductor element or the like is formed over the substrate 301 to form the layer 401. The layer 401 is a layer where a semiconductor circuit is formed over the above-described semiconductor substrate or insulating substrate. The layer 401 includes the substrate 301 and the semiconductor circuit formed over the substrate 301. The semiconductor circuit includes a semiconductor element that includes the conductive layer 241 (the conductive layer 241R, the conductive layer 241G, and the conductive layer 241B in FIG. 8A). Alternatively, the semiconductor circuit includes the conductive layer 241 as a wiring, a plug, or the like that is electrically connected to the semiconductor element. Examples of the semiconductor element include a transistor, a diode, and a capacitor. The semiconductor circuit preferably forms, for example, a pixel circuit, a gate line driver circuit (a gate driver), or a source line driver circuit (a source driver). In addition to the above, an arithmetic circuit, a memory circuit, or the like may be formed.

Next, the insulating layer 255 is formed over the layer 401 that includes the conductive layer 241R, the conductive layer 241G, and the conductive layer 241B.

For example, an inorganic insulating layer, an organic insulating layer, a stacked-layer structure including an inorganic insulating layer and an organic insulating layer, or the like can be used as the insulating layer 255. The organic insulating layer, which functions as a planarization film in some cases, is preferable.

For an insulating film to be an insulating layer such as the insulating layer 255, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

As the insulating film to be the insulating layer such as the insulating layer 255, an organic insulating film can be used, for example. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

After the insulating film to be the insulating layer 255 is formed, planarization treatment using a chemical mechanical polishing (CMP) method or the like may be performed.

Planarization of a surface of the insulating layer 255 may improve the thickness uniformity of layers constituting a light-emitting element, which are formed over the insulating layer 255. Improving the thickness uniformity of the layers may inhibit a short circuit or the like in the light-emitting element. In addition, improving the thickness uniformity of the layers may increase the reliability of the light-emitting element.

Figure 8A:
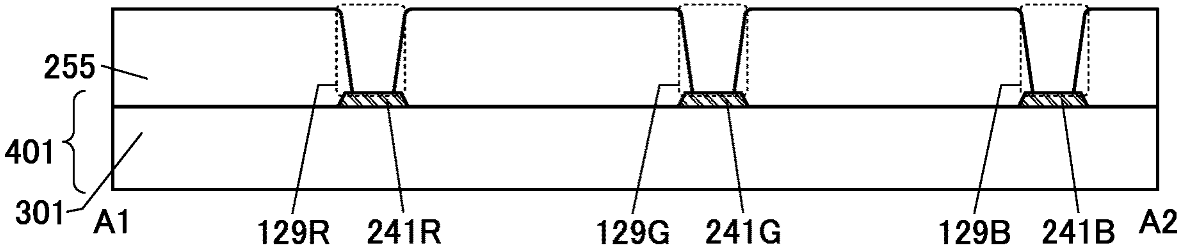
FIG. 8A to FIG. 8D are diagrams illustrating an example of a method for manufacturing a display device.

Next, an opening portion 129 is provided in the insulating layer 255 so that a top surface of the conductive layer 241 is exposed (FIG. 8A).

Then, a conductive film to be the pixel electrode 111 is provided over the insulating layer 255 and the exposed conductive layer 241. The conductive film to be the pixel electrode 111 is preferably provided along a bottom surface and a side surface of the opening portion 129.

Next, a film to be the optical adjustment layer 115 is provided over the conductive film to be the pixel electrode 111.

In the case where a conductive film having a property of reflecting visible light is used as the pixel electrode 111, a material that has a reflectance as high as possible in the whole wavelength range of visible light (e.g., silver or aluminum) is preferably used. This can increase color reproducibility as well as light extraction efficiency of the light-emitting elements.

Figure 8B:
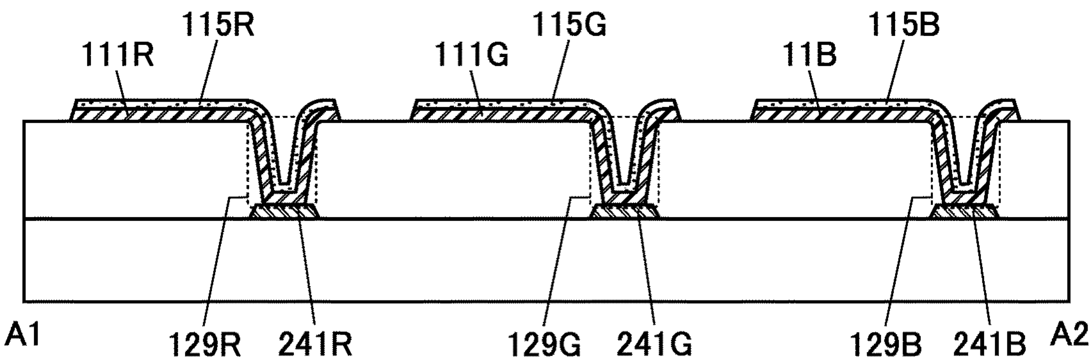

Next, part of the film to be the optical adjustment layer 115 and part of the conductive film to be the pixel electrode 111 are removed using a resist mask or the like, so that the pixel electrode 111R, the pixel electrode 111G, the pixel electrode 111B, the optical adjustment layer 115R, the optical adjustment layer 115G, and the optical adjustment layer 115B are formed (FIG. 8B).

[Formation of Insulating Layer 131 and Insulating Layer 132]

Figure 8C:
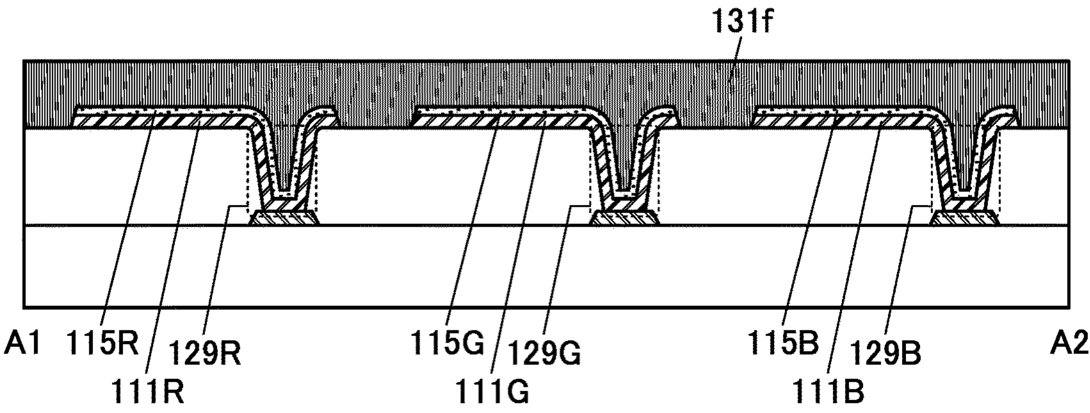

Next, an insulating film 131*f* to be the insulating layer 131 and the insulating layer 132 is formed (FIG. 8C). The insulating film 131*f* is provided so as to cover the pixel electrode 111. The insulating film 131*f* is preferably a planarization film.

A resin is preferably used for the insulating film 131*f* The insulating film 131*f* is, for example, an organic insulating film.

Examples of materials that can be used for the insulating film 131*f* include an acrylic resin, a polyimide resin, an epoxy resin, a polyamide resin, a polyimide-amide resin, a siloxane resin, a benzocyclobutene-based resin, a phenol resin, and precursors of these resins.

Figure 8D:
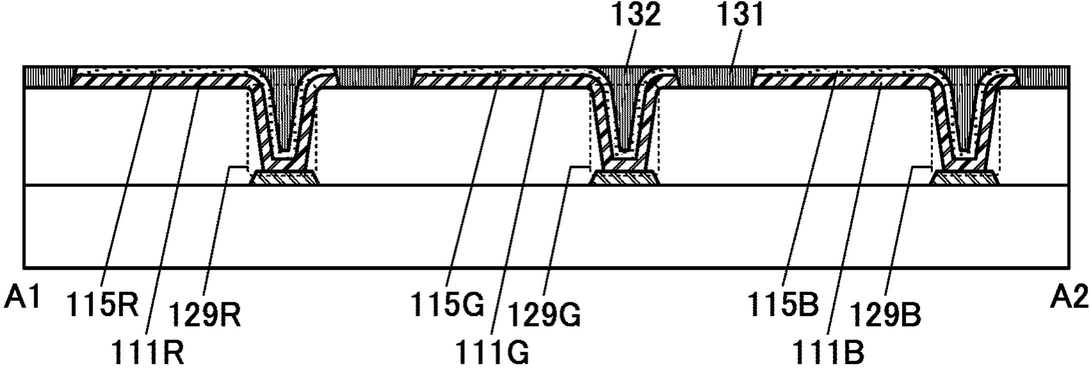

Next, the insulating film 131*f* is etched to expose top surfaces of the optical adjustment layer 115R, the optical adjustment layer 115G, and the optical adjustment layer 115B, so that the insulating layer 131 and the insulating layer 132 are formed (FIG. 8D). Note that in the case where the optical adjustment layer 115 is not used (e.g., the structure of the display device in FIG. 1B), top surfaces of the pixel electrode 111R, the pixel electrode 111G, and the pixel electrode 111B are exposed. The etching of the insulating film 131*f* is performed substantially uniformly on the top surface of the insulating film 131*f* Such uniform etching for planarization is also referred to as etch back.

A dry etching method or a wet etching method can be used for the etching of the insulating film 131*f*. The etching of the insulating film 131*f* may be performed by ashing using oxygen plasma or the like. Note that the ashing using oxygen plasma has advantages such as high controllability, good in-plane uniformity, and high suitability for treatment using a large-sized substrate and thus can be suitably used for removal of part of the insulating film 131*f* Chemical mechanical poliching (CMP) may be used for the etching of the insulating film 131*f*.

As illustrated in FIG. 8D, the insulating film 131*f* is etched so that a top surface of the insulating layer 132 is substantially aligned with a top surface of the optical adjustment layer 115. The insulating layer 132 is provided so that the top surface of the insulating layer 132 and the top surface of the optical adjustment layer 115 are substantially aligned with each other, whereby coverage can be improved in formation of the EL layer 112 and the common electrode 113 described later.

The surface planarity of the insulating film 131*f* may change due to unevenness of the formation surface and the sparseness and density of the pattern formed on the formation surface. The planarity of the insulating film 131*f* may change due to the viscosity or the like of a material used for the insulating film 131*f*.

For example, the thickness of the insulating film 131*f* may be smaller in a region over the pixel electrode 111 and the optical adjustment layer 115 formed inside the opening of the insulating layer 255 than in a region between two of the pixel electrodes 111. In such a case, for example, etch back of the insulating film 131*f* is performed, whereby the top surface of the insulating layer 132 is lower than of a top surface of the insulating layer 131 in some cases.

The insulating film 131*f* may have a hollow shape and a bulging shape, for example, in the region over the pixel electrode 111 and the optical adjustment layer 115 formed inside the opening of the insulating layer 255 and the region between two of the pixel electrodes 111.

[Formation of EL Film 112Rf]

Next, the EL film 112Rf to be the EL layer 112R later is formed over the optical adjustment layer 115R, the optical adjustment layer 115G, the optical adjustment layer 115B, the insulating layer 132, and the insulating layer 131.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, or an inkjet method. Without limitation to this, the above-described deposition method can be used as appropriate.

[Formation of Sacrificial Film 144*a*]

Next, a sacrificial film 144*a* is formed to cover the EL film 112Rf.

The sacrificial film 144*a* can be formed by, for example, a sputtering method, an ALD method (a thermal ALD method or a PEALD method), or a vacuum evaporation method. A formation method that causes less damage to an EL layer is preferred, and an ALD method or a vacuum evaporation method is more suitable for the formation of the sacrificial film 144*a* than a sputtering method.

As the sacrificial film 144*a*, it is possible to use a film highly resistant to etching treatment performed on various EL films such as the EL film 112Rf, i.e., a film having high etching selectivity. Furthermore, as the sacrificial film 144*a*, it is possible to use a film having high etching selectivity with respect to a protective film such as a protective film 146*a* described later. Moreover, as the sacrificial film 144*a*, it is possible to use a film that can be removed by wet etching causing less damage to the EL films. In the case of using wet etching, it is preferable to use a developer, an aqueous solution of tetramethylammonium hydroxide (TMAH), diluted hydrofluoric acid, oxalic acid, phosphoric acid, acetic acid, nitric acid, a chemical solution containing a mixed solution thereof, or the like, for example.

The sacrificial film 144*a* can be formed using, for example, an inorganic film such as a metal film, an alloy film, a metal oxide film, a semiconductor film, or an inorganic insulating film.

For the sacrificial film 144*a*, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, an oxide containing indium can be used for the sacrificial film 144*a*.

As the oxide containing indium, a metal oxide such as indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Furthermore, an inorganic insulating material such as aluminum oxide, hafnium oxide, or silicon oxide can be used for the sacrificial film 144*a*. In particular, an aluminum oxide film formed by an ALD method is preferably used as the sacrificial film 144*a*, in which case damage caused to an underlying layer (especially an EL layer or the like) during film formation can be reduced.

[Formation of Protective Film 146*a*]

Next, the protective film 146*a* is formed over the sacrificial film 144*a*.

The protective film 146*a* is a film that is used as a hard mask when the sacrificial film 144*a* is etched later. In a later step of processing the protective film 146*a*, the sacrificial film 144*a* is exposed. Thus, the combination of films having high etching selectivity therebetween is selected for the sacrificial film 144*a* and the protective film 146*a*. It is thus possible to select a film that can be used for the protective film 146*a* depending on etching conditions of the sacrificial film 144*a* and etching conditions of the protective film 146*a*.

For example, in the case where dry etching using a gas containing fluorine (also referred to as a fluorine-based gas) is used for the etching of the protective film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146*a*. Here, a metal oxide film such as IGZO or ITO is given as a film having high etching selectivity (that is, enabling low etching rate) in dry etching using the fluorine-based gas, and such a film can be used as the sacrificial film 144*a*.

Without being limited to the above, a material of the protective film 146*a* can be selected from a variety of materials depending on etching conditions of the sacrificial film 144*a* and the protective film 146*a*. For example, any of the films that can be used for the sacrificial film 144*a* can be used.

In the case where an aluminum oxide film is used as the sacrificial film 144*a*, an oxide containing indium is preferably used as the protective film 146*a*, for example. The oxide containing indium can be etched well by wet etching in some cases, resulting in less etching damage to the EL layer.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, as the protective film 146*a*, an organic film that can be used for the EL film 112Rf or the like can be used. For example, the organic film that is used as the EL film 112Rf, an EL film 112Gf, or an EL film 112Bf can be used for the protective film 146*a*. Such an organic film is preferably used, in which case the deposition apparatus for the EL film 112Rf or the like can be used in common.

[Formation of Resist Mask 143*a*]

Figure 9A:
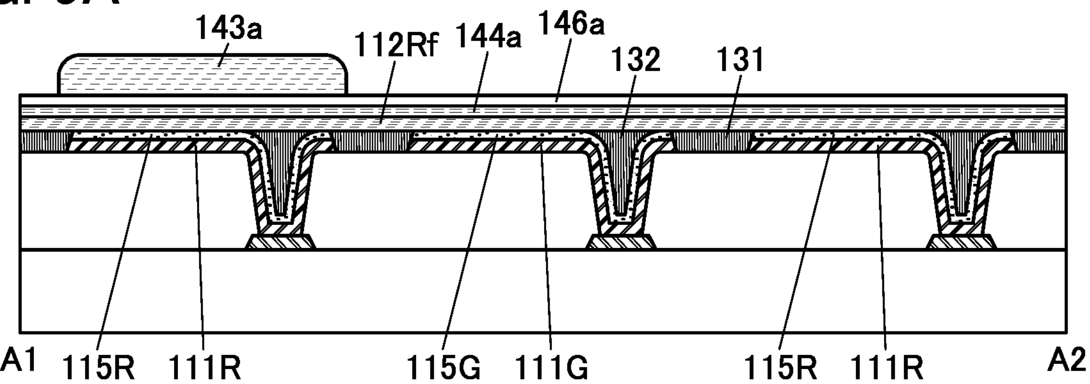
FIG. 9A to FIG. 9C are diagrams illustrating the example of the method for manufacturing the display device.

Next, a resist mask 143*a* is formed over the protective film 146*a* (FIG. 9A).

For the resist mask 143*a*, a resist material containing a photosensitive resin such as a positive type resist material or a negative type resist material can be used.

Here, in the case where the protective film 146*a* is not provided and the resist mask 143*a* is formed over the sacrificial film 144*a*, if a defect such as a pinhole exists in the sacrificial film 144*a*, there is a risk of dissolving the EL film 112Rf due to a solvent of the resist material. Such a defect can be prevented by using the protective film 146*a*.

[Etching of Protective Film 146*a*]

Next, part of the protective film 146*a* that is not covered with the resist mask 143*a* is removed by etching, so that an island-shaped or band-shaped protective layer 147*a* is formed.

In the etching of the protective film 146*a*, an etching condition with high selectively is preferably employed so that the sacrificial film 144*a* is not removed by the etching. Either wet etching or dry etching can be performed for the etching of the protective film 146*a*; with use of dry etching, shrinking of a pattern of the protective film 146*a* can be inhibited.

[Removal of Resist Mask 143*a*]

Next, the resist mask 143*a* is removed.

The resist mask 143*a* can be removed by wet etching or dry etching. It is particularly preferable to perform dry etching (also referred to as plasma ashing) using an oxygen gas as an etching gas to remove the resist masks 143*a*.

In that case, the resist mask 143*a* is removed in a state where the EL film 112Rf is covered with the sacrificial film 144*a*; thus, the EL film 112Rf is less likely to be affected by the removal. In particular, when the EL film 112Rf is exposed to oxygen, the electrical characteristics are adversely affected in some cases; therefore, it is preferable that the EL film 112Rf be covered with the sacrificial film 144*a* when etching using an oxygen gas, such as plasma ashing, is performed.

[Etching of Sacrificial Film 144*a*]

Next, part of the sacrificial film 144*a* that is not covered with the protective layer 147*a* is removed by etching with use of the protective layer 147*a* as a mask, so that an island-shaped or band-shaped sacrificial layer 145*a* is formed.

Either wet etching or dry etching can be used to etch the sacrificial film 144*a*; dry etching is preferably used, in which case shrinkage of the pattern can be inhibited.

[Etching of EL Film 112Rf]

Next, part of the EL film 112Rf that is not covered with the sacrificial layer 145*a* is removed by etching, so that the island-shaped or band-shaped EL layer 112R is formed.

For the etching of the EL film 112Rf, it is preferable to use dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a rare gas such as He. Alternatively, a mixed gas of the above gas and a dilute gas that does not contain oxygen can be used as the etching gas. In the etching of the EL film 112Rf, the protective layer 147*a* may be removed.

[Formation of EL Layer 112G and EL Layer 112B]

Next, the EL film 112Gf to be the EL layer 112G is formed over the sacrificial layer 145*a*. For the EL film 112Gf, the description of the EL film 112Rf can be referred to.

Then, a sacrificial film 144*b* is formed over the EL film 112Gf, and a protective film 146*b* is formed over the sacrificial film 144*b*. For the sacrificial film 144*b*, the description of the sacrificial film 144*a* can be referred to. For the protective film 146*b*, the description of the protective film 146*a* can be referred to.

Figure 9B:
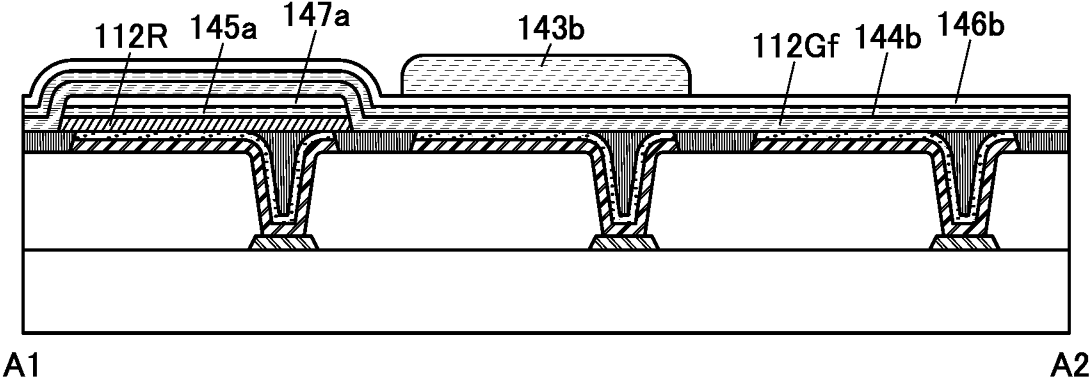

Next, a resist mask 143*b* is formed over the protective film 146*b* (FIG. 9B).

Then, the protective film 146*b* is etched with use of the resist mask 143*b*, so that a protective layer 147*b* is formed. After that, the resist mask 143*b* is removed.

Next, the sacrificial film 144*b* and the EL film 112Gf are each etched with use of the protective layer 147*b* as a mask, so that a sacrificial layer 145*b* and the EL layer 112G are formed.

Next, the EL film 112Bf to be the EL layer 112B is formed over the sacrificial layer 145*a* and the sacrificial layer 145*b*. For the EL film 112Bf, the description of the EL film 112Rf can be referred to.

Next, a sacrificial layer 144*c* is formed over the EL film 112Bf, and a protective film 146*c* is formed over the sacrificial layer 144*c*. For the sacrificial layer 144*c*, the description of the sacrificial film 144*a* can be referred to. For the protective film 146*c*, the description of the protective film 146*a* can be referred to.

Figure 9C:
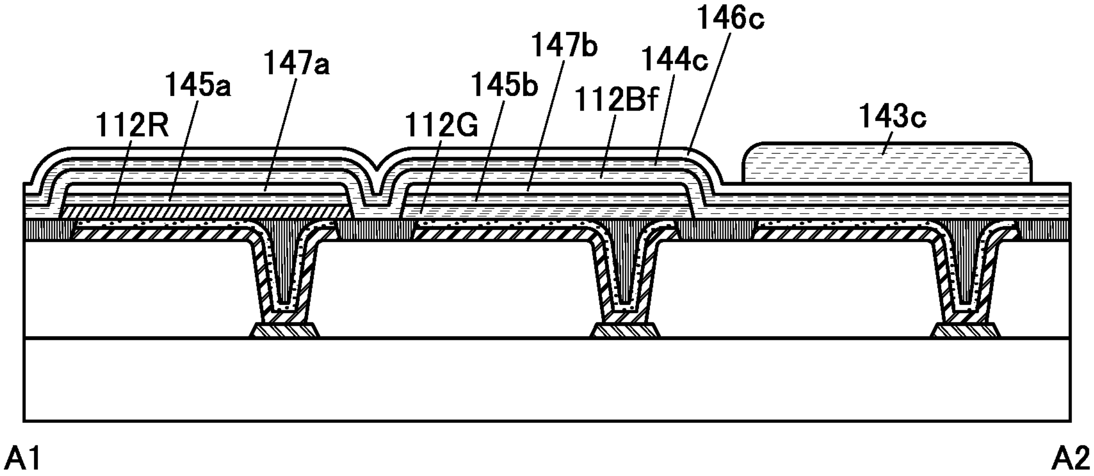

Next, a resist mask 143*c* is formed over the protective film 146*c* (FIG. 9C).

Then, the protective film 146*c* is etched with use of the resist mask 143*c*, so that a protective layer 147*c* is formed. After that, the resist mask 143*c* is removed.

Figure 10A:
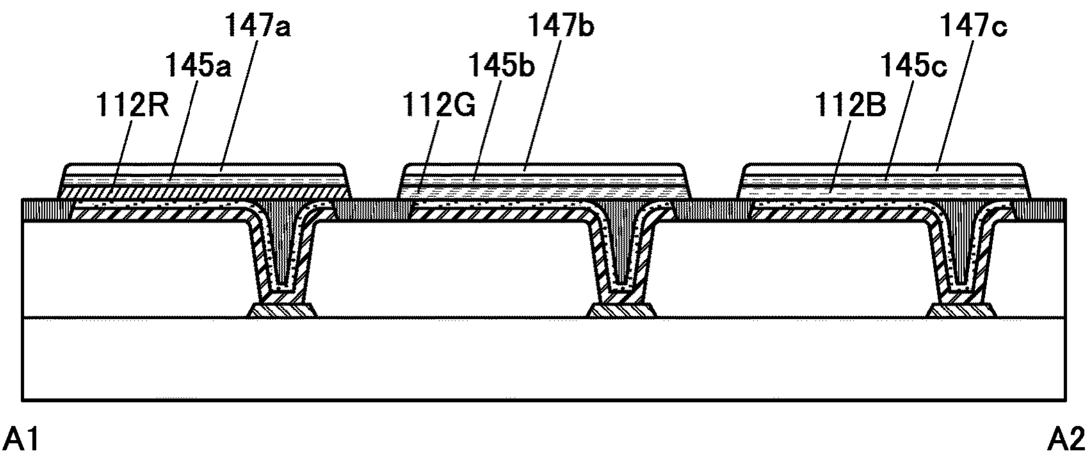
FIG. 10A and FIG. 10B are diagrams illustrating the example of the method for manufacturing the display device.

Next, the sacrificial layer 144*c* and the EL film 112Bf are each etched with use of the protective layer 147*c* as a mask, so that the sacrificial layer 145*c* and the EL layer 112B are formed (FIG. 10A).

[Removal of Protective Layers and Sacrificial Layers]

Next, the protective layer 147*a*, the protective layer 147*b*, the protective layer 147*c*, the sacrificial layer 145*a*, the sacrificial layer 145*b*, and the sacrificial layer 145*c* are removed to expose top surfaces of the EL layer 112R, the EL layer 112G, and the EL layer 112B.

The protective layer 147*a*, the protective layer 147*b*, and the protective layer 147*c* can be removed by wet etching or dry etching.

The sacrificial layer 145*a*, the sacrificial layer 145*b*, and the sacrificial layer 145*c* can be removed by wet etching or dry etching. In this case, a method that causes damage to the EL layer 112R, the EL layer 112G, and the EL layer 112B as little as possible is preferably employed. In particular, wet etching is preferably used. For example, wet etching using an aqueous solution of tetramethylammonium hydroxide (TMAH), diluted hydrofluoric acid, oxalic acid, phosphoric acid, acetic acid, nitric acid, or a mixed solution thereof is preferably performed. With use of these conditions of wet etching, for example, damage to the insulating layer can be reduced.

In this manner, the EL layer 112R, the EL layer 112G, and the EL layer 112B can be formed separately.

[Formation of Common Layer 114]

Next, the common layer 114 is formed. Note that in the case where the common layer 114 is not included, the common electrode 113 is formed to cover the EL layer 112R, the EL layer 112G, and the EL layer 112B.

[Formation of Common Electrode 113]

Then, the common electrode 113 is formed over the common layer 114. The common electrode 113 can be formed by, for example, a sputtering method or an evaporation method.

Through the above steps, the light-emitting element 110R, the light-emitting element 110G, and the light-emitting element 110B can be manufactured.

[Formation of Protective Layer 121]

Figure 10B:
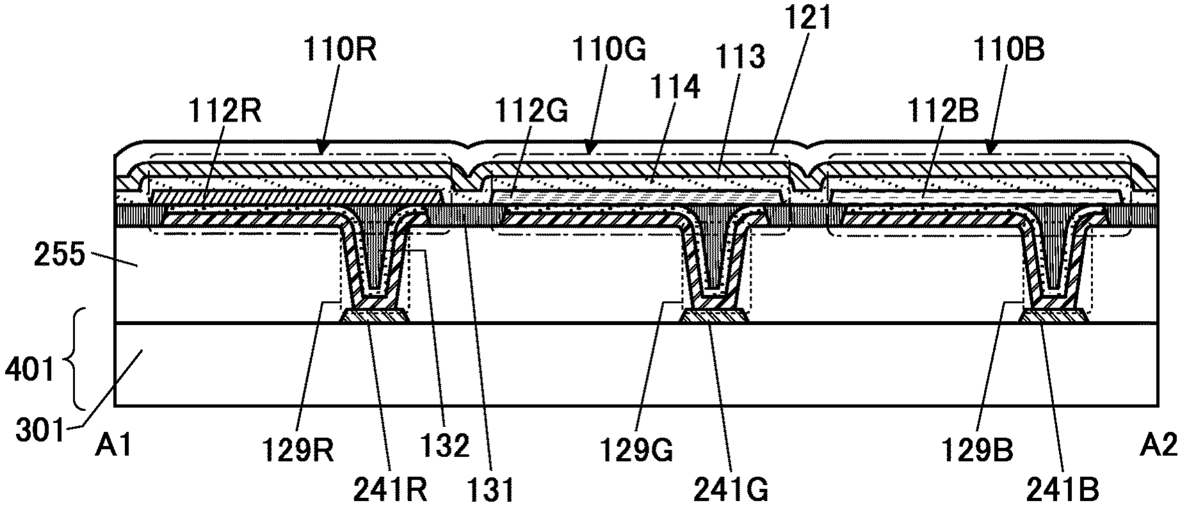

Next, the protective layer 121 is formed over the common electrode 113 (FIG. 10B). An inorganic insulating film used for the protective layer 121 is preferably formed by a sputtering method, a PECVD method, or an ALD method. In particular, an ALD method is preferable because it provides excellent step coverage and is less likely to cause a defect such as a pinhole. An organic insulating film is preferably formed by an inkjet method, in which case a uniform film can be formed in a desired area.

Through the above-described steps, the display device 100 illustrated in FIG. 4A can be manufactured.

At least part of the structure examples, the drawings corresponding thereto, and the like described in this embodiment as an example can be combined with the other structure examples, the other drawings, and the like as appropriate.

Embodiment 2

In this embodiment, structure examples of display devices of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 11:
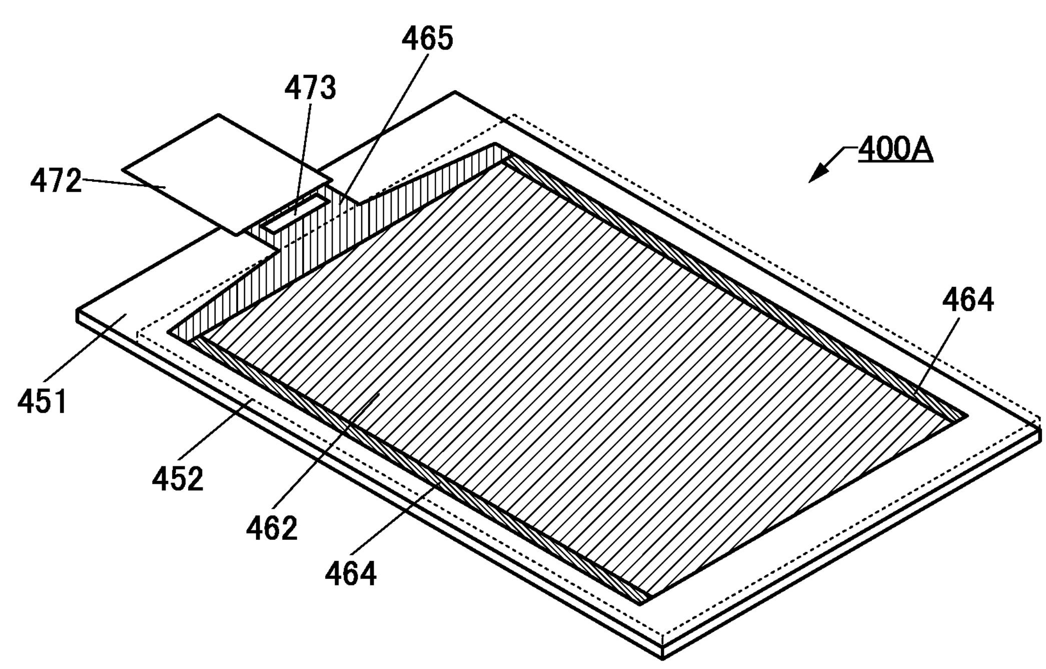
FIG. 11 is a perspective view illustrating an example of a display device.
Figure 12:
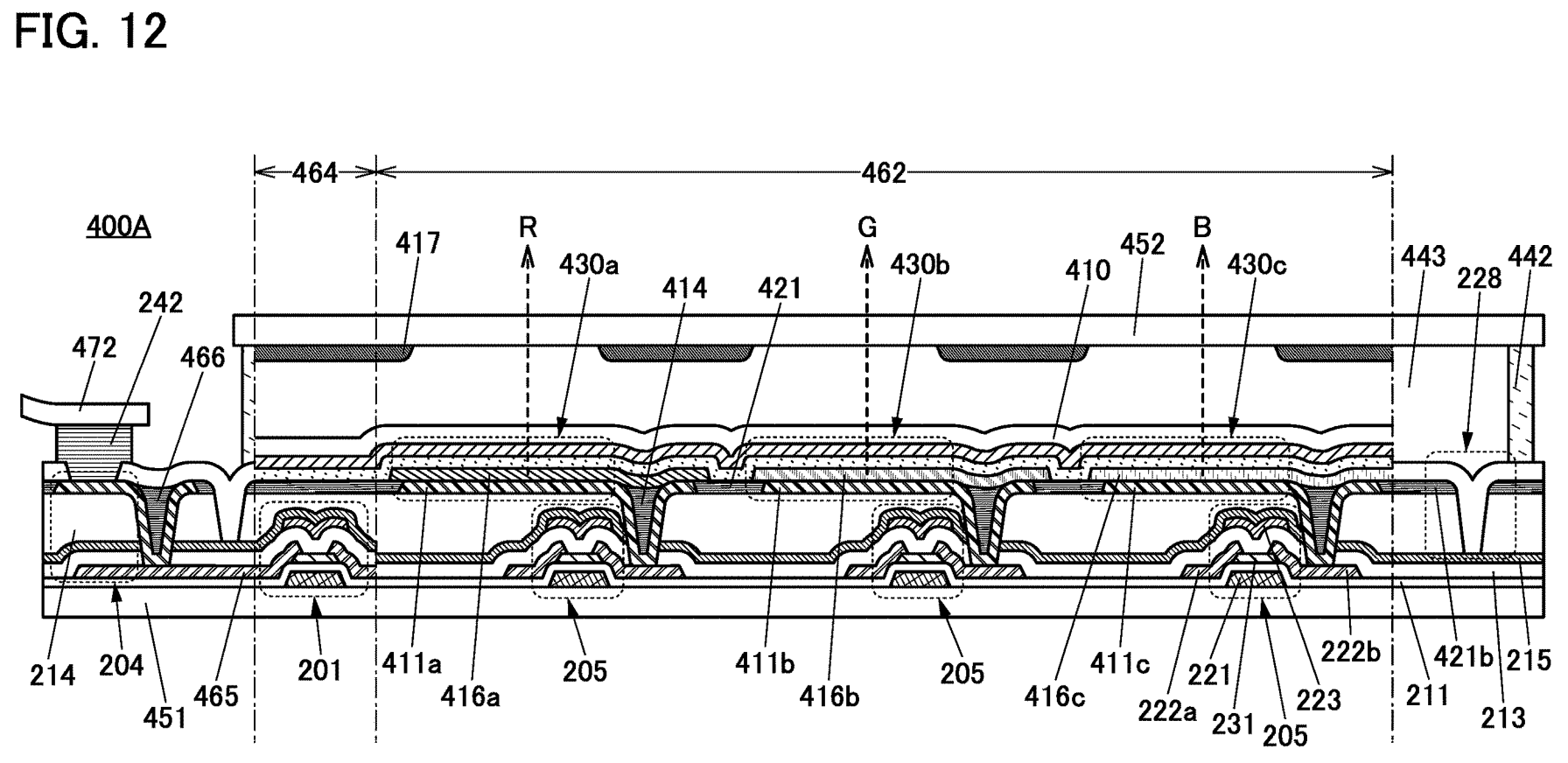

FIG. 11 is a perspective view of a display device 400A, and FIG. 12 is a cross-sectional view of the display device 400A.

The display device 400A has a structure in which a substrate 452 and a substrate 451 are bonded to each other. In FIG. 11, the substrate 452 is denoted by a dashed line.

The display device 400A includes a display portion 462, a circuit 464, a wiring 465, and the like. FIG. 11 illustrates an example in which an IC 473 and an FPC 472 are mounted on the display device 400A. Thus, the structure illustrated in FIG. 11 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or from the IC 473.

FIG. 11 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 12 illustrates examples of cross sections of part of a region including the FPC 472, part of the circuit 464, part of the display portion 462, and part of a region including an end portion of the display device 400A.

The display device 400A illustrated in FIG. 12 includes a transistor 201, a transistor 205, a light-emitting element 430*a* that emits red light, a light-emitting element 430*b* that emits green light, a light-emitting element 430*c* that emits blue light, and the like between the substrate 451 and the substrate 452.

The light-emitting element described in Embodiment 1 can be used as the light-emitting element 430*a*, the light-emitting element 430*b*, and the light-emitting element 430*c*.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 410 and the substrate 452 are bonded to each other with an adhesive layer 442. A solid sealing structure, a hollow sealing structure, or the like can be employed to seal the light-emitting elements. In FIG. 12, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

Parts of a conductive layer 411*a*, a conductive layer 411*b*, and a conductive layer 411*c* are provided over an insulating layer 214. In opening portions provided in the insulating layer 214 so that top surfaces of conductive layers 222*b* included in transistors 205 are exposed, the other parts of the conductive layers 411*a*, 411*b*, and 411*c* are formed along bottom surfaces and side surfaces of the opening portions. The conductive layer 411*a*, the conductive layer 411*b*, and the conductive layer 411*c* are each connected to the conductive layer 222*b* included in the transistor 205 through the opening provided in the insulating layer 214. The pixel electrodes contain a material that reflects visible light, and a counter electrode contains a material that transmits visible light.

The pixel electrode 111 described in the above embodiment can be used as the conductive layer 411*a*, the conductive layer 411*b*, and the conductive layer 411*c*. Alternatively, the stacked-layer structure including the pixel electrode 111 and the optical adjustment layer 115 over the pixel electrode, which are described in the above embodiment, can be employed.

For the insulating layer 214, the insulating layer 255 described in the above embodiment can be referred to.

An insulating layer 414 is provided between top surfaces of regions in the conductive layer 411*a*, the conductive layer 411*b*, and the conductive layer 411*c* positioned inside the openings provided in the insulating layer 214 and an EL layer 416*a* included in a light-emitting element 430*a*, an EL layer 416*b* included in a light-emitting element 430*b*, and an EL layer 416*c* included in a light-emitting element 430*c*, respectively. For the insulating layer 414, the insulating layer 132 described in the above embodiment can be referred to.

An insulating layer 421 is provided in a region positioned between the light-emitting element 430*a* and the light-emitting element 430*b* and over the insulating layer 214 and in a region positioned between the light-emitting element 430*b* and the light-emitting element 430*c* and over the insulating layer 214. For the insulating layer 421, the insulating layer 131 described in the above embodiment can be referred to.

Light from the light-emitting element is emitted toward the substrate 452 side. For the substrate 452, a material having a high visible-light-transmitting property is preferably used.

The transistor 201 and the transistor 205 are formed over the substrate 451. These transistors can be formed using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and functions as a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12, an opening is formed in a two-layer structure of the insulating layer 214 and an insulating layer 421*b* over the insulating layer 214. The insulating layer 421*b* can be formed using the same material as the insulating layer 421. The insulating layer 421*b* is formed through the same process as the insulating layer 421, for example. The protective layer 410 is formed to cover the opening. Using an inorganic layer as the protective layer 410 can inhibit entry of impurities into the display portion 462 from the outside through the insulating layer 214 even when an organic insulating film is used as the insulating layer 214. Consequently, the reliability of the display device 400A can be improved.

Each of the transistor 201 and the transistor 205 includes a conductive layer 221 functioning as a gate, the insulating layer 211 functioning as a gate insulating layer, a conductive layer 222*a* functioning as one of a source and a drain, the conductive layer 222*b* functioning as the other of the source and the drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. As the conductive layer 466, a conductive film obtained by processing the same conductive film as the pixel electrode or a conductive film obtained by processing a stacked film of the same conductive film as the pixel electrode and the same conductive film as the optical adjustment layer can be used. On a top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 410 covering the light-emitting elements inhibits entry of impurities such as water into the light-emitting elements; as a result, the reliability of the light-emitting elements can be increased.

In the region 228 in the vicinity of the end portion of the display device 400A, the insulating layer 215 and the protective layer 410 are preferably in contact with each other through an opening in the insulating layer 214. In particular, the inorganic insulating film included in the insulating layer 215 and the inorganic insulating film included in the protective layer 410 are preferably in contact with each other. This can inhibit entry of impurities into the display portion 462 from the outside through the organic insulating film. Consequently, the reliability of the display device 400A can be improved.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. For that reason, a film with a low water absorption rate is preferably used for the substrate. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Furthermore, a stacked-layer film of the above materials can be used for a conductive layer. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting element.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400B]

Figures 13A, 13B:
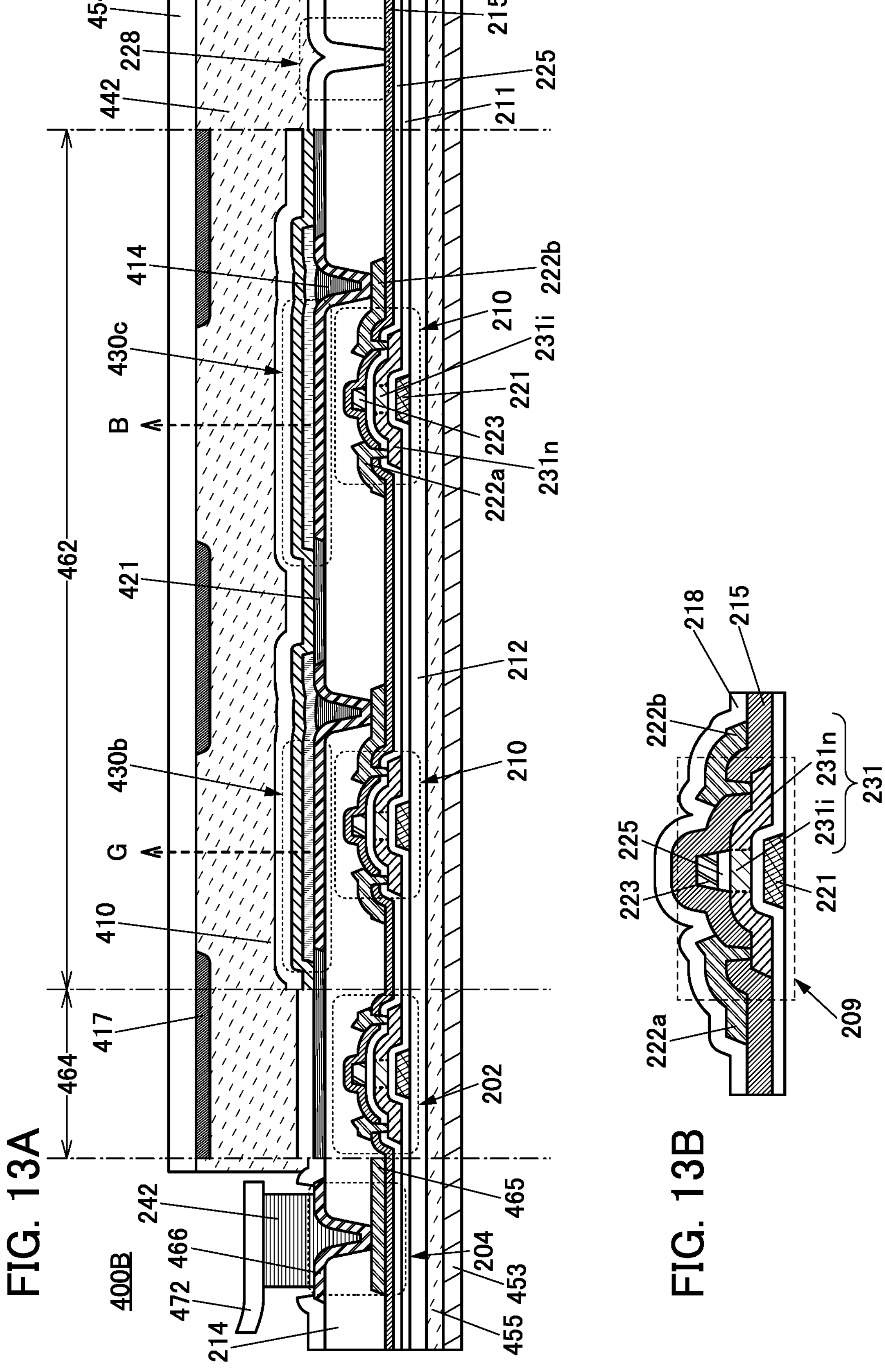
FIG. 13A is a cross-sectional view illustrating an example of a display device.
FIG. 13B is a cross-sectional view illustrating an example of a transistor.

FIG. 13A is a cross-sectional view of a display device 400B. A perspective view of the display device 400B is similar to that of the display device 400A (FIG. 11). FIG. 13A illustrates examples of cross sections of part of a region including the FPC 472, part of the circuit 464, and part of the display portion 462 in the display device 400B. FIG. 13A specifically illustrates an example of a cross section of a region including the light-emitting element 430*b* emitting green light and the light-emitting element 430*c* emitting blue light in the display portion 462. Note that portions similar to those of the display device 400A are not described in some cases.

The display device 400B illustrated in FIG. 13A includes a transistor 202, transistors 210, the light-emitting element 430*b*, the light-emitting element 430*c*, and the like between a substrate 453 and a substrate 454.

The substrate 454 and the protective layer 410 are bonded to each other with the adhesive layer 442. The adhesive layer 442 is provided to overlap with the light-emitting element 430*b* and the light-emitting element 430*c*, and the display device 400B employs a solid sealing structure.

The substrate 453 and an insulating layer 212 are bonded to each other with an adhesive layer 455.

FIG. 13A is different from FIG. 12 in that the insulating layer 421*b* is not included in the region 228.

As a method for manufacturing the display device 400B, first, a manufacture substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the manufacture substrate, whereby the components formed over the manufacture substrate are transferred to the substrate 453. The substrate 453 and the substrate 454 are preferably flexible. Accordingly, the display device 400B can be highly flexible.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 231*n* through an opening provided in the insulating layer 215 and an insulating layer 225. The transistor 210 has a function of controlling the driving of the light-emitting element.

The insulating layer 421 is provided between the light-emitting element 430*b* and the light-emitting element 430*c*.

Light from the light-emitting elements 430*b* and 430*c* is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215 and the insulating layer 225. One of the conductive layer 222*a* and the conductive layer 222*b* functions as a source, and the other functions as a drain.

FIG. 13A illustrates an example in which the insulating layer 225 covers a top surface and a side surface of the semiconductor layer. The conductive layer 222*a* and the conductive layer 222*b* are connected to the corresponding low-resistance regions 231*n* through openings provided in the insulating layer 225 and the insulating layer 215.

In a transistor 209 illustrated in FIG. 13B, the insulating layer 225 overlaps with the channel formation region 231*i* of the semiconductor layer 231 and does not overlap with the low-resistance regions 231*n*. The structure illustrated in FIG. 13B is obtained by processing the insulating layer 225 with the conductive layer 223 as a mask, for example. In FIG. 13B, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

Embodiment 3

In this embodiment, a structure example of a display device different from those described above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figures 14A, 14B:
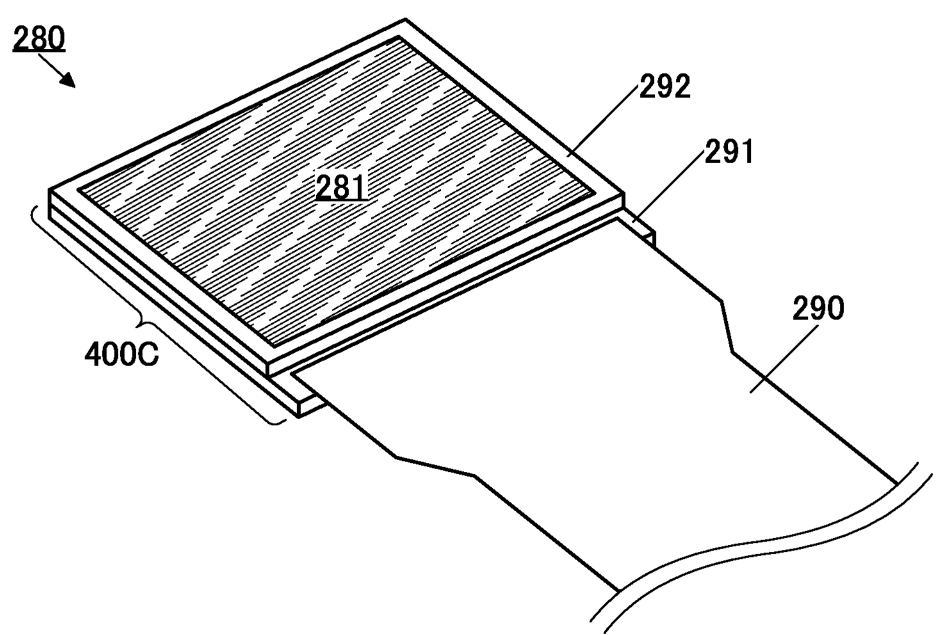
FIG. 14A and FIG. 14B are perspective views illustrating an example of a display module.

FIG. 14A is a perspective view of a display module 280. The display module 280 includes a display device 400C and an FPC 290.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be perceived.

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 14B. The pixel 284*a* includes the light-emitting elements 430*a*, 430*b*, and 430*c* that emit light of different colors from each other. The plurality of light-emitting elements are preferably arranged in a stripe pattern as illustrated in FIG. 14B. With the stripe pattern that enables high-density arrangement of the light-emitting elements of one embodiment of the present invention or pixel circuits, a high-resolution display device can be provided. Alternatively, a variety of arrangement methods, such as delta arrangement and pentile arrangement, can be employed.

The pixel circuit portion 283 includes a plurality of pixel circuits 283*a* arranged periodically.

One pixel circuit 283*a* is a circuit that controls light emission of three light-emitting elements included in one pixel 284*a*. One pixel circuit 283*a* may be provided with three circuits each of which controls light emission of one light-emitting element. For example, the pixel circuit 283*a* can include at least one selection transistor, one current control transistor (driving transistor), and a capacitor for one light-emitting element. In this case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a wrist watch.

At least part of the structure examples, the drawings corresponding thereto, and the like described in this embodiment as an example can be combined with the other structure examples, the other drawings, and the like as appropriate.

Embodiment 4

In this embodiment, light-emitting elements (also referred to as light-emitting devices) that can be used in a display device that is one embodiment of the present invention will be described.

<Structure Example of Light-Emitting Element>

Figure 15A:
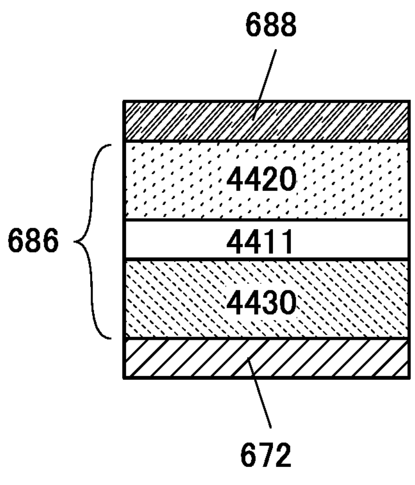
FIG. 15A to FIG. 15D are diagrams each illustrating a structure example of a light-emitting element.

As illustrated in FIG. 15A, the light-emitting element includes an EL layer 686 between a pair of electrodes (a lower electrode 672 and an upper electrode 688). The EL layer 686 can be formed of a plurality of layers, e.g., a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 15A is referred to as a single structure in this specification.

Figure 15B:
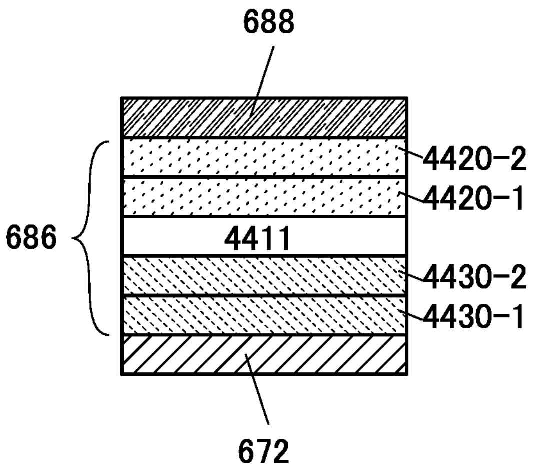

FIG. 15B illustrates a modification example of the EL layer 686 included in the light-emitting element illustrated in FIG. 15A. Specifically, the light-emitting element illustrated in FIG. 15B includes a layer 4430-1 over the lower electrode 672, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 688 over the layer 4420-2. For example, when the lower electrode 672 functions as an anode and the upper electrode 688 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 672 functions as a cathode and the upper electrode 688 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be increased.

Figure 15C:
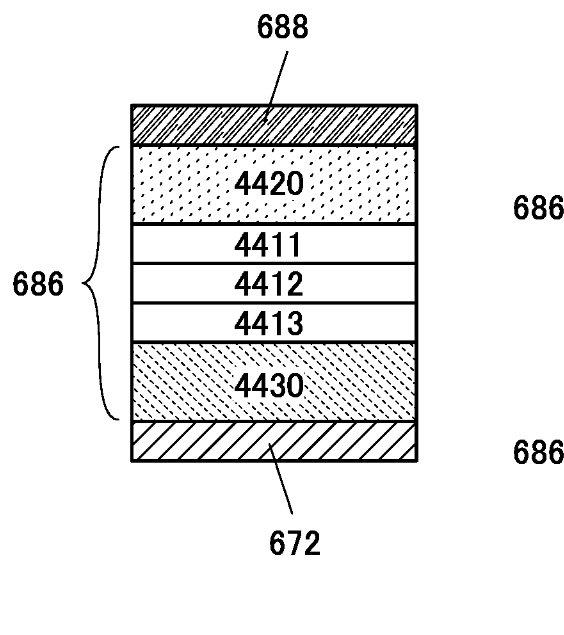

Note that the structure in which a plurality of light-emitting layers (a light-emitting layer 4411, a light-emitting layer 4412, and a light-emitting layer 4413) is provided between the layer 4420 and the layer 4430 as illustrated in FIG. 15C is another variation of the single structure.

Figure 15D:
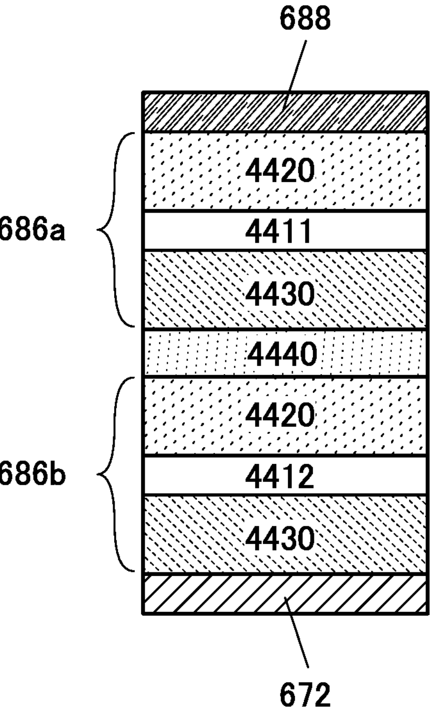

The structure in which a plurality of light-emitting units (an EL layer 686*a* and an EL layer 686*b*) is connected in series with an intermediate layer (charge-generation layer) 4440 therebetween as illustrated in FIG. 15D is referred to as a tandem structure in this specification. In this specification and the like, the structure shown in FIG. 15D is referred to as a tandem structure; however, without being limited to this, a tandem structure may be referred to as a stack structure, for example. The tandem structure enables a light-emitting element to emit light with high luminance.

In FIG. 15C and FIG. 15D, the layer 4420 and the layer 4430 may each have a stacked-layer structure of two or more layers as in FIG. 15B.

The emission color of the light-emitting element can be red, green, blue, cyan, magenta, yellow, white, or the like depending on the material that constitutes the EL layer 686. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. The same applies to a light-emitting element including three or more light-emitting layers.

The light-emitting layer preferably contains two or more selected from light-emitting substances that emit light of red (R), green (G), blue (B), yellow (Y), orange (0), and the like. A light-emitting substance that emits light of violet, bluish violet, yellowish blue, near infrared, and the like may be included. Alternatively, the light-emitting layer preferably contains two or more light-emitting substances that emit light containing two or more of color spectral components of R, G, and B.

At least part of the structure examples, the drawings corresponding thereto, and the like described in this embodiment as an example can be combined with the other structure examples, the other drawings, and the like as appropriate.

Embodiment 5

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved. An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier in some cases. Thus, a transistor including an oxide semiconductor containing hydrogen tends to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, electronic devices of one embodiment of the present invention will be described with reference to FIG. 16 to FIG. 19.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display device of one embodiment of the present invention can have high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic device can have higher realistic sensation, sense of depth, and the like in personal use such as portable use and home use. With such a display device with high resolution and high definition, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figures 16A, 16B:
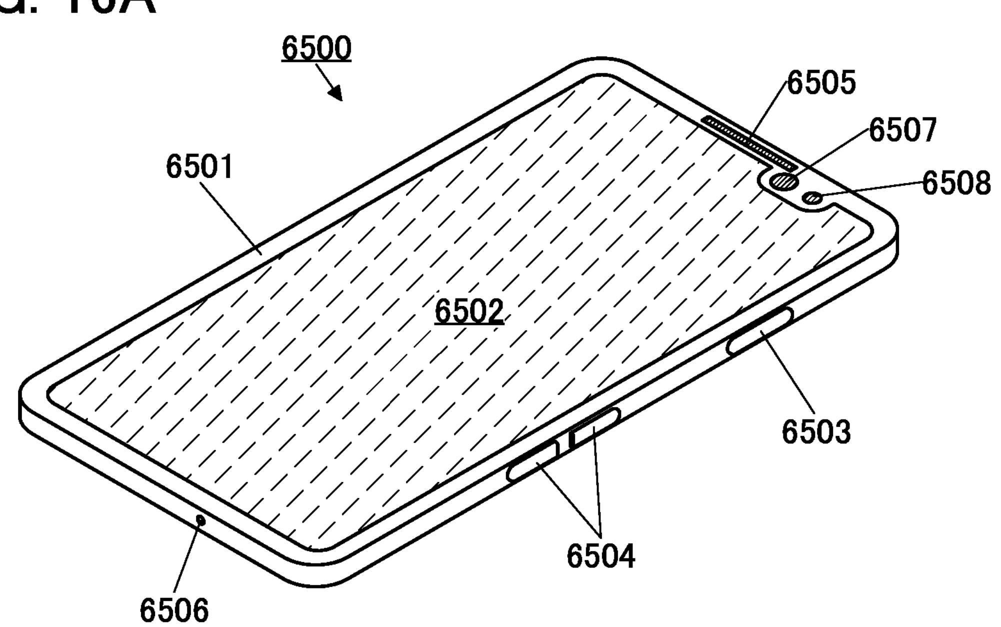
FIG. 16A and FIG. 16B are diagrams illustrating an example of an electronic device.

An electronic device 6500 in FIG. 16A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

FIG. 16B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

FIG. 17A illustrates an example of a television device. In a television device 7100, a display portion 7000 is incorporated in a housing 7101. Here, the housing 7101 is supported by a stand 7103.

The display device of one embodiment of the present invention can be used in the display portion 7000.

The television device 7100 illustrated in FIG. 17A can be operated with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 17B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

FIG. 17C and FIG. 17D illustrate examples of digital signage.

A digital signage 7300 illustrated in FIG. 17C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 17D illustrates a digital signage 7400 mounted on a cylindrical pillar 7401. The digital signage 7400 includes the display portion 7000 provided along a curved surface of the pillar 7401.

The display device of one embodiment of the present invention can be used in the display portion 7000 illustrated in each of FIG. 17C and FIG. 17D.

A larger area of the display portion 7000 can increase the amount of data that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 17C and FIG. 17D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 18A is a diagram illustrating appearance of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing 8001 may be integrated with each other in the camera 8000.

Images can be taken by pressing the shutter button 8004 of the camera 8000 or touching the display portion 8002 thereof functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

The display device of one embodiment of the present invention can be used in the display portion 8002 of the camera 8000 and the display portion 8102 of the finder 8100. Note that a finder may be incorporated in the camera 8000.

FIG. 18B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 is provided with a camera, and information on the movement of the user's eyeball or eyelid can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

The display device of one embodiment of the present invention can be used in the display portion 8204.

FIG. 18C to FIG. 18E are diagrams illustrating the appearance of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably, in which case the user can feel high realistic sensation. Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used in the display portion 8302. The display device of one embodiment of the present invention can achieve extremely high resolution. For example, a pixel is not easily perceived by the user even when the user perceives display that is magnified by the use of the lenses 8305 as illustrated in FIG. 18E. In other words, a video with a strong sense of reality can be seen by the user with use of the display portion 8302

FIG. 18F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can enhance a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 19A to FIG. 19F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 19A to FIG. 19F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used in the display portion 9001.

The electronic devices illustrated in FIG. 19A to FIG. 19F will be described in detail below.

Figures 19A, 19B, 19C, 19D, 19E, 19F:
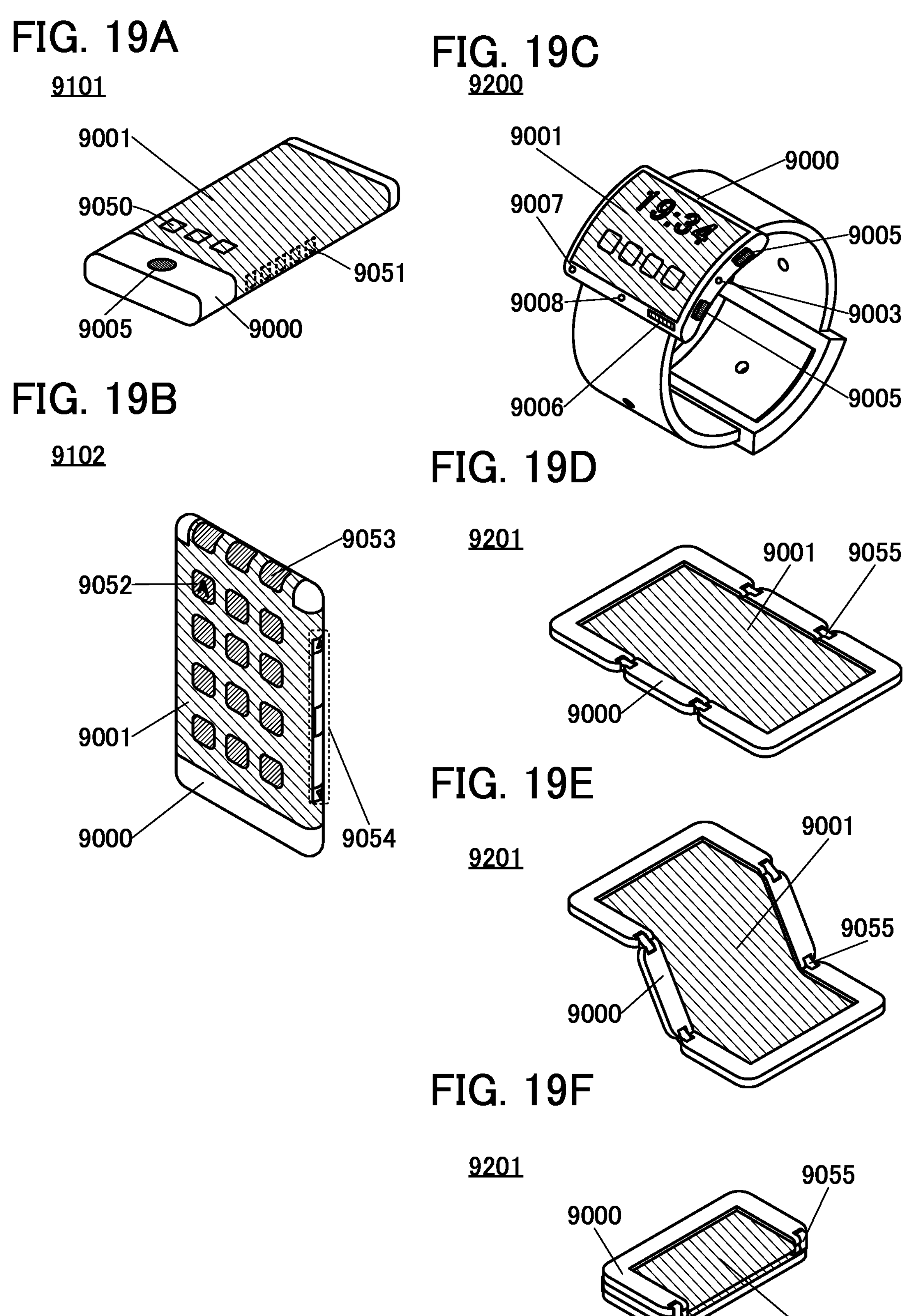
FIG. 19A to FIG. 19F are diagrams illustrating examples of electronic devices.

FIG. 19A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 19A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

FIG. 19B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

FIG. 19C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 19D to FIG. 19F are perspective views illustrating a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable when folded and is highly browsable when opened because of its seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

REFERENCE NUMERALS

100: display device, 110: light-emitting element, 110B: light-emitting element, 110G: light-emitting element, 110R: light-emitting element, 111: pixel electrode, 111B: pixel electrode, 111G: pixel electrode, 111R: pixel electrode, 112: EL layer, 112B: EL layer, 112Bf: EL film, 112G: EL layer, 112Gf: EL film, 112R: EL layer, 112Rf: EL film, 113: common electrode, 114: common layer, 115: optical adjustment layer, 115B: optical adjustment layer, 115G: optical adjustment layer, 115R: optical adjustment layer, 121: protective layer, 128: region, 129: opening portion, 129B: opening portion, 129G: opening portion, 129R: opening portion, 130: region, 130*a*: region, 130*b*: region, 131: insulating layer, 131*f*: insulating film, 132: insulating layer, 143*a*: resist mask, 143*b*: resist mask, 143*c*: resist mask, 144*a*: sacrificial film, 144*b*: sacrificial film, 144*c*: sacrificial film, 145*a*: sacrificial layer, 145*b*: sacrificial layer, 145*c*: sacrificial layer, 146*a*: protective film, 146*b*:

protective film, 146*c*: protective film, 147*a*: protective layer, 147*b*: protective layer, 147*c*: protective layer, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 241: conductive layer, 241B: conductive layer, 241G: conductive layer, 241R: conductive layer, 242: connection layer, 255: insulating layer, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 291: substrate, 292: substrate, 301: substrate, 400A: display device, 400B: display device, 400C: display device, 401: layer, 410: protective layer, 411*a*: conductive layer, 411*b*: conductive layer, 411*c*: conductive layer, 414: insulating layer, 416*a*: EL layer, 416*b*: EL layer, 416*c*: EL layer, 417: light-blocking layer, 419: resin layer, 420: substrate, 421: insulating layer, 421*b*: insulating layer, 430*a*: light-emitting element, 430*b*: light-emitting element, 430*c*: light-emitting element, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 672: lower electrode, 686: EL layer, 686*a*: EL layer, 686*b*: EL layer, 688: upper electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

a first conductive layer;

a first insulating layer over the first conductive layer;

a second conductive layer comprising a first region over the first insulating layer and a second region in an opening provided in the first insulating layer;

a second insulating layer over the first insulating layer;

a third insulating layer over the second region;

an EL layer comprising a third region over the first region, a fourth region over the second insulating layer, and a fifth region over the third insulating layer; and a third conductive layer over the EL layer, wherein the opening is provided in the first insulating layer so as to reach a top surface of the first conductive layer, and wherein a top surface of the first region, a top surface of the second insulating layer, and a top surface of the third insulating layer are substantially level with each other.

2. The display device according to claim 1, wherein an end portion of the second conductive layer is in contact with a bottom surface of the EL layer.

3. The display device according to claim 1, wherein the EL layer is in contact with the second insulating layer and the third insulating layer.

4. The display device according to claim 1, wherein an end portion of the EL layer overlaps with the second insulating layer.

5. The display device according to claim 1, wherein the third conductive layer is in contact with the second insulating layer.

6. A display device comprising:

a first conductive layer;

a second conductive layer;

a first insulating layer over the first conductive layer and the second conductive layer;

a first light-emitting element;

a second light-emitting element; and a second insulating layer between the first light-emitting element and the second light-emitting element, wherein the first light-emitting element comprises:

a third conductive layer comprising a first region over the first insulating layer and a second region in a first opening provided in the first insulating layer;

a third insulating layer over the second region; and a first EL layer comprising a third region over the first region, a fourth region over the second insulating layer, and a fifth region over the third insulating layer, wherein the second light-emitting element comprises:

a fourth conductive layer comprising a sixth region over the first insulating layer and a seventh region in a second opening provided in the first insulating layer;

a fourth insulating layer over the seventh region; and a second EL layer comprising an eighth region over the sixth region, a ninth region over the second insulating layer, and a tenth region over the fourth insulating layer, wherein the first opening is provided in the first insulating layer so as to reach a top surface of the first conductive layer, wherein the second opening is provided in the first insulating layer so as to reach a top surface of the second conductive layer, and wherein a top surface of the first region, a top surface of the second insulating layer, a top surface of the third insulating layer, and a top surface of the fourth insulating layer are substantially level with each other.

7. The display device according to claim 6, further comprising:

a fifth conductive layer, wherein the fifth conductive layer overlaps with the first EL layer and the second EL layer, and wherein the fifth conductive layer is configured to be an upper electrode of the first light-emitting element and an upper electrode of the second light-emitting element.

8. The display device according to claim 6, wherein an end portion of the third conductive layer is in contact with a bottom surface of the first EL layer, and wherein an end portion of the fourth conductive layer is in contact with a bottom surface of the second EL layer.

9. The display device according to claim 7, wherein the first EL layer is in contact with the second insulating layer and the third insulating layer, and wherein the second EL layer is in contact with the second insulating layer and the fourth insulating layer.

10. The display device according to claim 6, wherein an end portion of the first EL layer and an end portion of the second EL layer overlap with the second insulating layer.

11. The display device according to claim 7, wherein the fifth conductive layer is in contact with the second insulating layer.

* * * * *